United States Patent
Sakimura et al.

(10) Patent No.: US 8,281,221 B2
(45) Date of Patent: *Oct. 2, 2012

(54) OPERATION METHOD OF MRAM INCLUDING CORRECTING DATA FOR SINGLE-BIT ERROR AND MULTI-BIT ERROR

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 1096 days.

This patent is subject to a terminal disclaimer.

(21) Appl. No.: 12/083,373

(22) PCT Filed: Oct. 17, 2006

(86) PCT No.: PCT/JP2006/320610
§ 371 (c)(1),
(2), (4) Date: Apr. 10, 2008

(87) PCT Pub. No.: WO2007/046350
PCT Pub. Date: Apr. 26, 2007

(65) Prior Publication Data
US 2009/0125787 A1    May 14, 2009

(30) Foreign Application Priority Data
Oct. 18, 2005 (JP) .................................. 2005-303351

(51) Int. Cl.
*G06F 11/00* (2006.01)
(52) U.S. Cl. .......................... 714/764; 714/768; 714/753
(58) Field of Classification Search .................. None
See application file for complete search history.

(56) References Cited

U.S. PATENT DOCUMENTS

| 5,056,095 A | 10/1991 | Horiguchi et al. |
| 5,758,050 A | 5/1998 | Brady et al. |
| 6,055,178 A | 4/2000 | Naji |
| 6,584,589 B1 | 6/2003 | Perner et al. |

(Continued)

FOREIGN PATENT DOCUMENTS

JP    2003-68096    3/2003

(Continued)

OTHER PUBLICATIONS

International Search Report dated Jul. 22, 2008 with Partial English-Language Translation.

(Continued)

*Primary Examiner* — Christopher McCarthy
(74) *Attorney, Agent, or Firm* — McGinn IP Law Group, PLLC

(57) ABSTRACT

An operation method of a MRAM of the present invention stores in memory arrays, error correction codes, each of which comprises of symbols, each of which comprises bits, and to which an error correction is possible in units of symbols. In the operation method, the symbols are read by using the reference cells different from each other. Moreover, when a correctable error is detected in a read data of the error correction code from data cells corresponding to an input address, (A) a data in the data cell corresponding to an error bit is corrected, for a first error symbol as an error pattern of one bit, and (B) a data in the reference cell that is used to read a second error symbol is corrected for a second error symbol as en error pattern of the bits.

20 Claims, 21 Drawing Sheets

U.S. PATENT DOCUMENTS

| | | | |
|---|---|---|---|
| 6,760,251 B2 | 7/2004 | Hidaka | |
| 6,885,579 B2 | 4/2005 | Sakimura et al. | |
| 6,898,113 B2 | 5/2005 | Tsuji | |
| 7,149,948 B2 * | 12/2006 | Davis et al. | 714/763 |
| 7,286,429 B1 | 10/2007 | Liaw et al. | |
| 7,499,314 B2 | 3/2009 | Yang et al. | |
| 7,733,729 B2 | 6/2010 | Boeve | |
| 7,747,926 B2 * | 6/2010 | Wise et al. | 714/763 |
| 7,770,079 B2 | 8/2010 | Radke et al. | |
| 7,865,797 B2 | 1/2011 | Eguchi et al. | |
| 2003/0023924 A1 * | 1/2003 | Davis et al. | 714/763 |
| 2003/0023925 A1 * | 1/2003 | Davis et al. | 714/763 |
| 2003/0172339 A1 * | 9/2003 | Davis et al. | 714/763 |
| 2005/0030799 A1 | 2/2005 | Smith et al. | |
| 2005/0055621 A1 * | 3/2005 | Adelmann et al. | 714/758 |
| 2007/0260962 A1 * | 11/2007 | Wise et al. | 714/763 |
| 2009/0141544 A1 * | 6/2009 | Sakimura et al. | 365/158 |
| 2011/0016371 A1 * | 1/2011 | Sakimura et al. | 714/763 |

FOREIGN PATENT DOCUMENTS

| | | |
|---|---|---|
| JP | 2003-115195 | 4/2003 |
| JP | 2003-115195 A | 4/2003 |
| JP | 2003-115197 | 4/2003 |
| JP | 2005-56556 | 3/2005 |
| JP | 2005-56556 A | 3/2005 |
| JP | 2005-85464 | 3/2005 |
| JP | 2005-85464 A | 3/2005 |
| JP | 2006-286047 | 10/2006 |
| JP | 2006-286047 A | 10/2006 |
| WO | WO 2007/046349 A1 | 4/2007 |
| WO | WO 2007/046350 | 4/2007 |

OTHER PUBLICATIONS

PCT/IB/338.

PCT/IB/373.

PCT/ISA/237.

Japanese Office Action dated Oct. 3, 2011 (with a partial English translation).

Japanese Office Action for a related foreign application (JP 2007-540970) dated Oct. 3, 2011 (with a partial English translation).

US Office Action in co-pending U.S. Appl. No. 12/596,243 dated May 15, 2012.

* cited by examiner

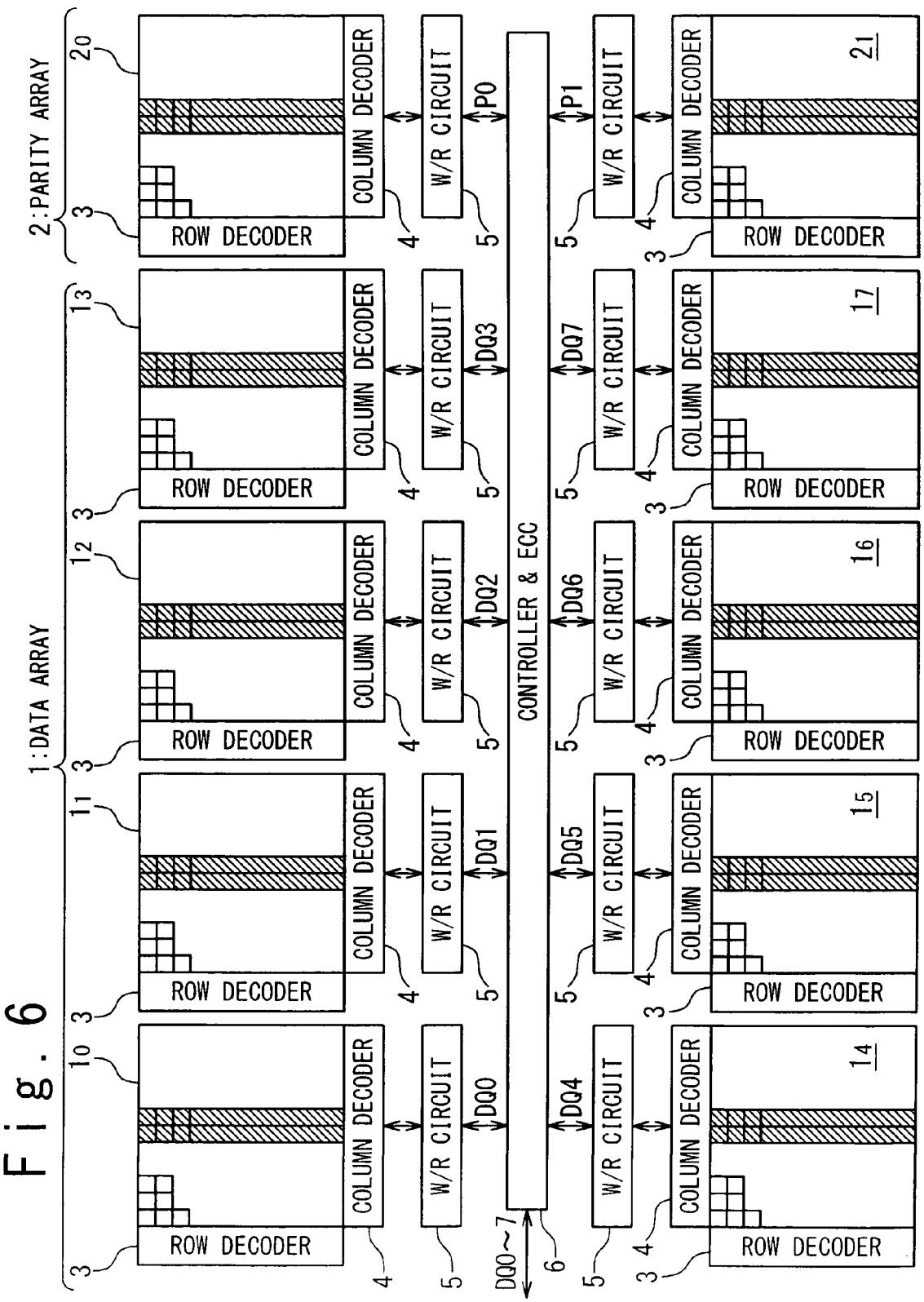

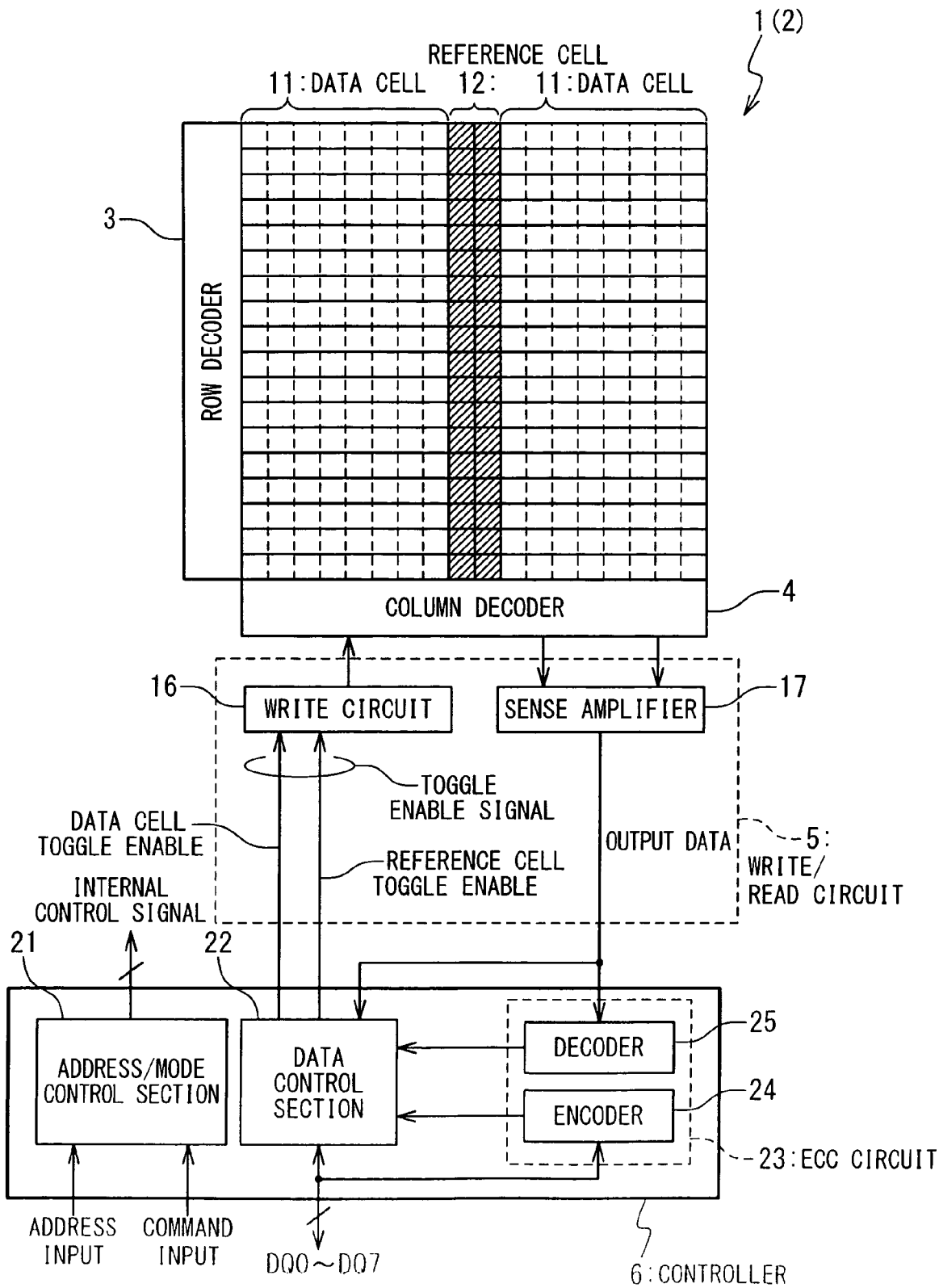

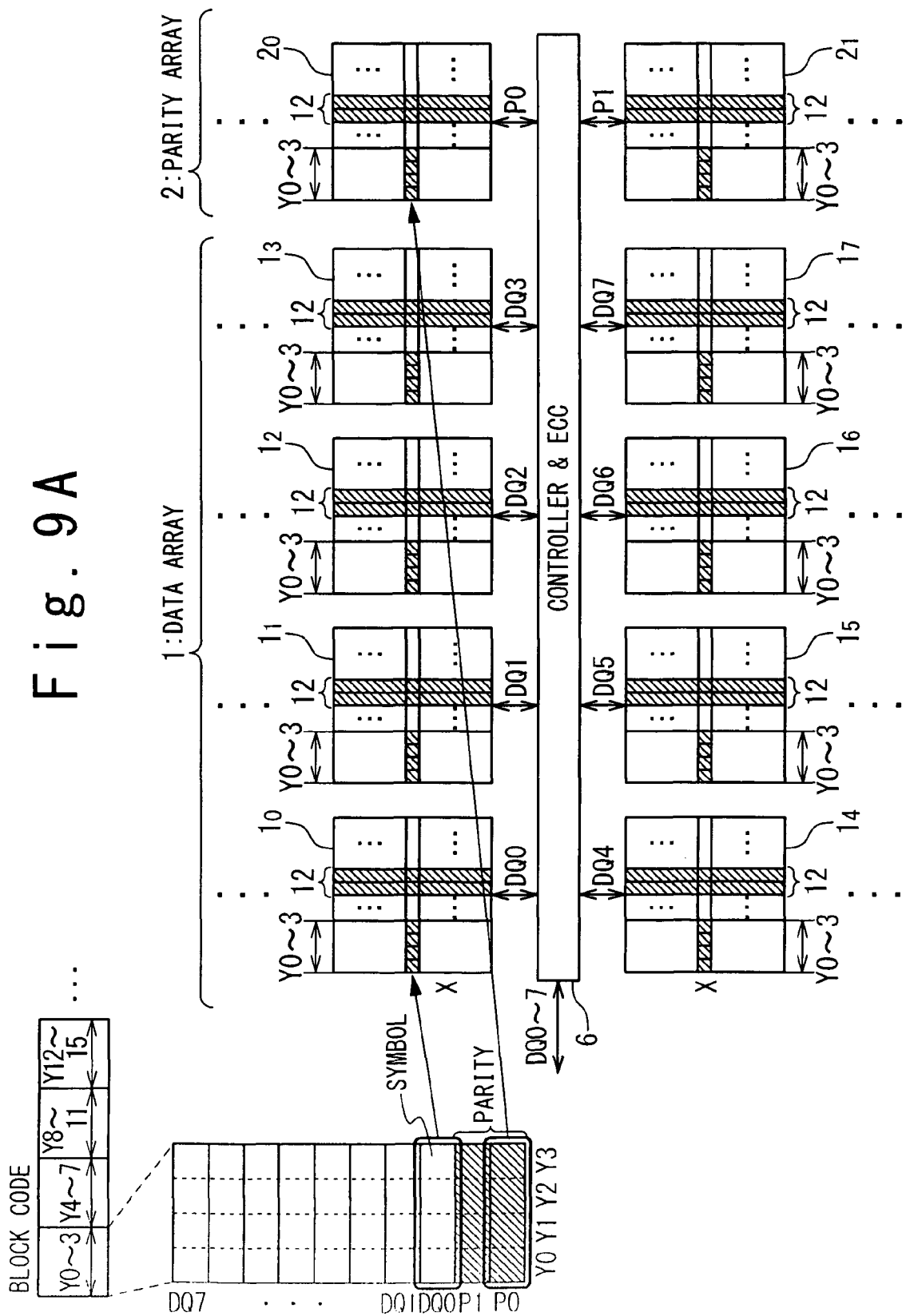

Fig. 9B
DATA ERROR IN DATA CELL     DATA ERROR IN REFERENCE CELL
 
POSSIBLE TO CORRECT OUTPUT DATA IN EITHER CASE

OPERATION METHOD OF MRAM INCLUDING CORRECTING DATA FOR SINGLE-BIT ERROR AND MULTI-BIT ERROR

TECHNICAL FIELD

The present invention relates to a magnetic random access memory (MRAM), and more particularly, relates to a MRAM in which an error correction is carried out on a data stored in a memory cell.

BACKGROUND ART

An MRAM is a non-volatile memory capable of a write/read operation at a high speed, and the research and development towards practical use has been carried out in recent years.

Generally, in the MRAM, a magneto-resistance element is used for a memory cell. The magneto-resistance element is composed of a magnetization free layer whose magnetization can be reversed, a magnetization pinned layer whose magnetization is pinned, and a non-magnetic layer formed between them. A data is stored as an orientation of the magnetization in the magnetization free layer. When the non-magnetic layer is formed from a very thin insulating film, the magneto-resistance element exhibits a TMR (Tunnel Magneto-Resistance) effect. The magneto-resistance element having such configuration is often referred to as an MTJ (Magnetic Tunnel Junction) element. On the other hand, when the non-magnetic layer is formed of a non-magnetic conductor, the magneto-resistance element exhibits a GMR (Giant Magneto-Resistive) effect. The magneto-resistance element having such configuration is referred to as a CPP-GMR (Current Perpendicular to Plane Giant Magneto-Resistive) element.

The write operation of the data is generally carried out by supplying write currents to a word line and a bit line, which are laid near a memory cell, to apply a magnetic field to the magnetization free layer, and reversing the magnetization of the magnetization free layer to a desirable direction.

On the other hand, when the data is read, the magneto-resistance effect exhibited by the magneto-resistance element is used. When any of the TMR effect and the GMR effect is used, the resistance of the memory cell varies on the basis of the magnetization orientation of the magnetization free layer. This change in the resistance of the memory cell appears as the change in a current flowing through the memory cell or the change in a voltage drop generated in the memory cell. This change in the current flowing through the memory cell or the voltage drop generated in the memory cell is detected, to discriminate the data of the memory cell.

When the data of the memory cell is determined, a reference cell in which a predetermined data is written is used. Hereinafter, in order to discriminate the reference cell, there is a case that the cell actually used to store the data is referred to as a data cell of the memory cells. In the MRAM in which the reference cell is provided, the determination of the data in the data cell is carried out by using the reference cell to generate a reference signal and then comparing a data signal obtained from the data cell with the reference signal.

As known in one skilled in the art, one subject of the MRAM lies in the selection property of the memory cell in a write operation. In the traditional MRAM, due to the variation in property of the memory cell, the data is written into half-selection memory cells, namely, the memory cells in which a write current is supplied to only one of the word line and the bit line. This undesirably reduces the reliability in the operation of the MRAM.

One method to improve the selection property in the write operation of the MRAM is a toggle write scheme (refer to U.S. Pat. No. 6,545,906). The toggle write scheme is a technique for carrying out the write operation whose selection property is high, by using SAF (Synthetic Anti-Ferro-Magnet) in the magnetization free layer. Here, the SAF is a structure in which the adjacent ferromagnetic layers composed of a plurality of ferromagnetic layers are magnetically coupled in anti-ferromagnetic manner.

FIG. 1 is a plan diagram showing a typical structure of the MRAM employing the toggle write method. Bit lines 102 and word lines 103 orthogonal to the bit lines 102 extend in a memory array in the MRAM. A magneto-resistance element 101 used as the memory cell is provided at each of positions at which the bit lines 102 and the word lines 103 intersect. As shown in FIG. 2, the magneto-resistance element 101 is composed of a magneto-resistance element, which contains an anti-ferromagnetic layer 111, a magnetization pinned layer 112, a barrier layer 113 and a magnetization free layer 114. As shown in FIG. 1, the magneto-resistance element 101 is arranged such that easy axes of the magnetization pinned layer 112 and the magnetization free layer 114 have the angles of 45 degrees with respect to the bit line 102 and the word line 103, namely, the longitudinal direction of the magneto-resistance element 101 has the angle of 45 degrees with respect to the bit line 102 and the word line 103.

Again, with reference to FIG. 2, the magnetization free layer 114 is composed of ferromagnetic layers 121 and 122 and a non-magnetic layer 123 formed between them. The entire residual magnetization of the magnetization free layer 114 (namely, the entire magnetization of the magnetization free layer 114 when an external magnetic field is 0) is made as close to 0 as possible. This is important, in order to generate a spin flop in the SAF. This condition can be satisfied, for example, by forming the two ferromagnetic layers 121 and 122 so that they are made of the same materials and have the same film thickness.

FIG. 3 is a conceptual diagram showing a procedure of the toggle write. FIG. 4 is a diagram showing the waveforms of the currents, which are supplied through the bit line 102 and the word line 103 when the data write operation is carried out based on the toggle write. In FIG. 3, attention should be paid to the fact that the magnetizations of the ferromagnetic layers 121 and 122 in the magnetization free layer 114 are indicated by symbols $M_1$, $M_2$, respectively.

The data write operation based on the toggle write method is carried out such that the direction of the magnetic field applied to the magnetization free layer 114 is rotated inside a plane and then the magnetizations of the ferromagnetic layers 121 and 122 of the magnetization free layer 114 are reversed by this magnetic field. Specifically, the write current is firstly supplied to the word line 103. Thus, a magnetic field $H_{WL}$ is generated in a direction orthogonal to the word line 103 (time $t_1$). Subsequently, while the write current is supplied through the word line 103, a write current is supplied to the bit line 102 (time $t_2$). Thus, a magnetic field $H_{WL}+H_{BL}$ is generated in the direction having the angle of 45 degrees with respect for both of the word line 103 and the bit line 102. Moreover, while a write current is supplied through the bit line 102, the supply of the write current to the word line 103 is stopped (time $t_3$). Therefore, a magnetic field $H_{BL}$ is generated in the direction orthogonal to the bit line 102 (namely, the direction parallel to the word line 103). Since with such a procedure, the write currents are supplied to the word line 103 and the bit line 102, the magnetic field applied to the magnetization free layer 114 is rotated, which can rotate the magnetizations of the ferromagnetic layers 121 and 122 of the magnetization free layer 114 by 180 degrees.

The remarkable fact lies in the fact that in the data write operation based on the toggle write method, only the reversal of the magnetization can be carried out, namely, only the reversal of the data can be carried out. For example, when a data "0" is written into a certain target memory cell, the data is firstly read from the target memory cell. Only when the read data is "1", the toggle write is carried out on the target memory cell, and the data "0" is stored in the target memory cell. If the read data is "0", the write operation into the target memory cell is not carried out.

Similarly to other many memory devices, it is impossible to avoid a data error of a memory cell in the MRAM. For example, it is impossible to avoid a write error in which a desirable data is not written in a write operation and a software error caused due to thermal disturbance, namely, undesirable reversal of the magnetization caused in a probability due to the thermal disturbance.

In order to deal with the generation of such data errors, similarly to other many memory devices, an error correction is desired to be employed even in the MRAM. For example, as disclosed in Japanese Patent Application Publications (JP-P 2003-68096A, JP-P 2003-115195A, JP-P 2003-115197A, JP-P 2005-56556A and JP-P 2005-85464A), in the MRAM employing the error correction, when a data is written, an error correction encoding is carried out on the data, and the data after the error correction encoding is written into a memory array. When the data is read, a syndrome is calculated from the data read from the memory array. When a data error is detected, the data for the error to be corrected is outputted to outside. At this time, the data stored in the memory array is simultaneously corrected.

However, in the error correction in the MRAM, the fact that even if the data error is detected, it must be considered whether it is caused in the data cell or the reference cell is not known. There is a case that the thermal disturbance causes the data written in the reference cell to be undesirably reversed although its probability is low. Thus, when the data error is detected and the data stored in the data cell is corrected, there is a fear that the data is erroneously corrected.

In addition, in the error correction in the MRAM, even if a data error exists in the reference cell, the error correction can be desirably carried out. The data error in the reference cell is easy to be generated as a burst error. However, when the burst error caused due to the data error in the reference cell has influence in an excessively wide range, the error correction becomes impossible.

From the above, the MRAM technique is desired that can correctly carry out an error correction, even if a data error is in any of a data cell and a reference cell.

DISCLOSURE OF INVENTION

It is therefore an object of the present invention to provide a technique that can correctly carry out an error correction, even if a data error exists in any of a data cell and a reference cell in the MRAM.

In one aspect of the present invention, the operation method of the MRAM stores in memory arrays, error correction codes, each of which comprises of symbols, each of which comprises bits, and to which an error correction is possible in units of symbols. In the operation method, the symbols are read by using the reference cells different from each other. Moreover, when a correctable error is detected in a read data of the error correction code from data cells corresponding to an input address, (A) a data in the data cell corresponding to an error bit is corrected, for a first error symbol as an error pattern of one bit, and (B) a data in the reference cell that is used to read a second error symbol is corrected for a second error symbol as en error pattern of the bits.

After the data in the data cell of the first error symbol is corrected in said (A), a re-reading operation and an error detecting operation are carried out to the data cell for the error correction code are carried out, and when a correctable error is detected again in the re-read data, it is preferred that (C) a data in the reference cell used to read the first error symbol is corrected, and the data in the data cell corrected in said (A) is re-corrected.

Also, in the operation method of the MRAM, a write data based on the error correction code is encoded from the input data. Then, when a correctable error is detected in the read data in the data cell of the error correction code corresponding to the input address, it is preferred that (D) the write data is written for a symbol with no error and a first error symbol as an error pattern of one bit, and (E) the write data is written, and the data in the reference cell used to read a second error symbol, for a second error symbol as an error pattern of a plurality of bits.

In the operation method of the MRAM, after a write operation of the first error symbol into a data cell in said (D) is carried out, it is preferred to perform a re-read operation and an error detecting operation on the data cell of the error correction code, and when a correctable error is detected in the re-read data again, to correct (F) the data in the reference cell used to read the first error symbol.

In this case, in the (F) operation, it is preferred to write the write data for the first error symbol.

Preferably, the symbols of the error correction codes are divided into information symbols and parity symbols, and a read operation from data cells for each of the parity symbols is carried out by using reference cells other than the reference cells used for a read operation from the data cells for each of the information symbols, and the parity symbols are used to detect a data error in the read data as the error correction code.

The information symbols and the parity symbols are stored in memory arrays different from each other, and a reference cell is preferably used which is arranged in a same memory array as each of the symbols for a read operation from a data cell for the symbol.

Preferably, one of the information symbols, one of the parity symbols, a first reference cell and a second reference cell are arranged in one memory array, the first reference cell is used for a read operation from the data cell for the information symbol, and the second reference cell is used for a read operation from the data cell for the parity symbol.

The error correction codes are divided into a first code and a second code based on an input address, and a first information symbol and a first parity symbol which are included in the first code, a second information symbol and a second parity symbol which are included in the second code, and a first reference cell and a second reference cell are arranged in a memory array. Preferably, when the first code is selected, the first reference cell is used for a read operation of the first information symbol from a data cell, and the second reference cell is used for a read operation of the first parity symbol from the data cell, and when the second code is selected, the second reference cell is used for a read operation of the second information symbol from a data cell, and the first reference cell is used for a read of the second parity symbol from a data cell.

In another aspect, the operation method of the MRAM according to the present invention is the operation method of the MRAM that contains data cells which store an error correction code to which error correction is possible in units of symbols, reference cells used for read from the data cells, and a peripheral circuit containing an ECC circuit, the error correction code comprising symbols, each of which comprises bits. Each cell of the data cells and the reference cells is a toggle cell in which a write operation is carried out by using a toggle operation that a storage data is reversed each time a write current is supplied, a read operation of the symbols is carried out by using different reference cells, and when a correctable error is detected in a read data from the data cells, the peripheral circuit compares bits of the read data and bits of decoded data outputted from the ECC circuit in case of a first error symbol as an error pattern of one bit, carries out a control of a toggle operation to the data cell of a different bit, namely, an error bit, and a control of the toggle operation to the reference cell used to read a second error symbol, in case of the second error symbol as an error pattern of plural bits.

After the data cell of the error bit included in the after the toggle operation is carried out to the data cell for an error bit included in the first error symbol, a re-read operation and an error detecting operation to the data cells of the error correction code are carried out. Then, when the error bit is detected again in a same symbol as the first error symbol, of the re-read data, the peripheral circuit carries out the control in which the toggle operation is performed to the reference cell used to read the first error symbol and a control the toggle operation is performed to the data cell to which the toggle operation has been performed previously.

The ECC circuit encodes a write data based on the error correction code from an input data. Preferably, when a correctable error is detected in a read data from the data cells for the error correction code corresponding to an input address, the peripheral circuit compares bits of the read data and bits of the write data in case of a symbol having no error and the first error symbol as the error pattern of one bit, and carries out the control to perform the toggle operation to the data cell having a different bit, and compares bits of decoded data outputted by the ECC circuit and the bits of the write data in case of the second error symbol as the error pattern of plural bits and carries out the control to perform the toggle operation to the reference cell used to read the second error symbol.

Preferably, after the toggle operation to the data cell of the first error symbol, the re-read operation and the error detecting operation are carried out to the data cells of the error correction code. Then, when the error bit is detected again in a same symbol as the first error symbol, of the re-read data, the peripheral circuit carries out the control to perform the toggle operation to the reference cell used to read the first error symbol, and the control to perform the toggle operation to the data cell for the error bit of one bit included in the first error symbol.

In still another aspect, the operation method of the MRAM according to the present invention is the operation method of the MRAM that contains data cells which store first to $m^{th}$ block codes as error correction codes to which error correction is possible in units of symbols, first to $n^{th}$ reference cells, and a peripheral circuit containing first to $m^{th}$ ECC circuits, each of the error correction codes comprising symbols, each of which comprises bits. The operation method of the MRAM is designed to read data of the first to $m^{th}$ block codes, while using an $i^{th}$ reference cell of the first to $n^{th}$ reference cells, when an $i^{th}$ symbol of each of the first to $m^{th}$ block codes is read, and the error detection is carried out on each of the first to $m^{th}$ block codes by using the first to $m^{th}$ ECC circuits. Also, the peripheral circuit corrects the data in the data cell for an error bit, when each of the first to $m^{th}$ ECC circuits detects a correctable error, and an error is detected in one $i^{th}$ symbol of the m $i^{th}$ symbols read by using the $i^{th}$ reference cell, and corrects the data of the $i^{th}$ reference cell, when the error is detected in plural $i^{th}$ symbols.

The $j^{th}$ ECC circuit of the first to $m^{th}$ ECC circuits encodes $j^{th}$ write data based on the error correction code from an input data. Preferably, the peripheral circuit writes the $j^{th}$ write data to the data cell for the $j^{th}$ block code, when each of the first to $m^{th}$ ECC circuits detects a correctable error, and the error is detected in one $i^{th}$ symbol of the m $i^{th}$ symbols read by using the $i^{th}$ reference cell, and writes the write data to the data cell of the $j^{th}$ block code and corrects data of the $i^{th}$ reference cell, when the error is detected in plural $i^{th}$ symbols.

The data cells and the reference cells are toggle cells in which a write operation is carried out by using a toggle operation in which a storage data is reversed, each time a write current is supplied. Preferably, when each of the first to $m^{th}$ ECC circuits detects a correctable error, the peripheral circuit compares bits of a read data of the $i^{th}$ symbol in a $k^{th}$ block code and bits of an $i^{th}$ symbol of decoded data outputted by the $k^{th}$ ECC circuit, in case of the error is detected in one $i^{th}$ symbol of the m $i^{th}$ symbols read by using the $i^{th}$ reference cell, namely, in case that an error symbol is detected only in the $i^{th}$ symbol of the $k^{th}$ block code of the first to $m^{th}$ block codes, and carries out the control to perform the toggle operation to the data cell of a different bit, namely, the error bit, and carries out the control to perform the toggle operation to data of the $i^{th}$ reference cell in case that the error is detected in plural $i^{th}$ symbols.

The data cells of the $j^{th}$ block code of the first to $m^{th}$ block codes are the data cells selected for an input address. Preferably, when each of the first to $m^{th}$ ECC circuits detects an correctable error, the peripheral circuit compares bits of the read data of the $i^{th}$ symbol in the $j^{th}$ block code and bits of the $i^{th}$ symbol in the decoded data outputted by the $j^{th}$ ECC circuit, in case that the error symbol is detected only in the $i^{th}$ symbol in the $j^{th}$ block code of the m $i^{th}$ symbols read by using the $i^{th}$ reference cell, and carries out the control to perform the toggle operation to the data cell of the different bit, namely, the error bit, and carries out the control to perform the toggle operation to the data in the $i^{th}$ reference cell in case that the error is detected in plural $i^{th}$ symbols, and further outputs the decoded data outputted by the $j^{th}$ ECC circuit to the external unit as the read data of the address.

The $j^{th}$ ECC circuit of the first to $m^{th}$ ECC circuits encodes the $j^{th}$ write data based on the error correction code from the input data. Preferably, when each of the first to $m^{th}$ ECC circuits detects a correctable error, the peripheral circuit compares the bits of the read data of the $i^{th}$ symbol in the $j^{th}$ block code and bits of the data of the $i^{th}$ symbol in the $j^{th}$ write data, in case that the error symbol is detected only in the $i^{th}$ symbol in the $j^{th}$ block code of the m $i^{th}$ symbols read by using the $i^{th}$ reference cell, and carries out the control to perform the toggle operation to the data cell of the different bit, and carries outs the control to perform the toggle operation to the data in the $i^{th}$ reference cell in case that the error is detected in plural $i^{th}$ symbols.

According to the present invention, the technique is provided that can correctly perform the error correction, even if a data error exists in any of the data cell and the reference cell of the MRAM.

BRIEF DESCRIPTION OF DRAWINGS

FIG. 6 is a block diagram showing the configuration of an MRAM according to the first exemplary embodiment of the present invention;

FIG. 7 is a block diagram showing the configurations of a data array, a parity array, a write/read circuit and a controller in the first exemplary embodiment;

FIG. 9A is a conceptual diagram showing an assigning method to the data array and parity array of an information symbol and a parity symbol in the first exemplary embodiment;

FIG. 9B is a diagram showing examples of data errors in a data cell and in the reference cell;

BEST MODE FOR CARRYING OUT THE INVENTION

Hereinafter, an MRAM of the present invention will be described below with reference to the attached drawings. It should be noted that the same or similar symbols indicate the same or corresponding members on the drawings.

First Exemplary Embodiment (Configuration of MRAM)

In the MRAM according to a first exemplary embodiment of the present invention, an error correction is carried out by using a block code in which one block is composed of a plurality of symbols. The block code is a code in which the encoded data is divided into the plurality of blocks, and encoding and decoding are carried out for each block. As the block code, for example, a humming code, a BCH code and a Reed-Solomon code (RS Code) are known. In the first exemplary embodiment, the Reed-Solomon code is used for the error correction.

Figure 5:
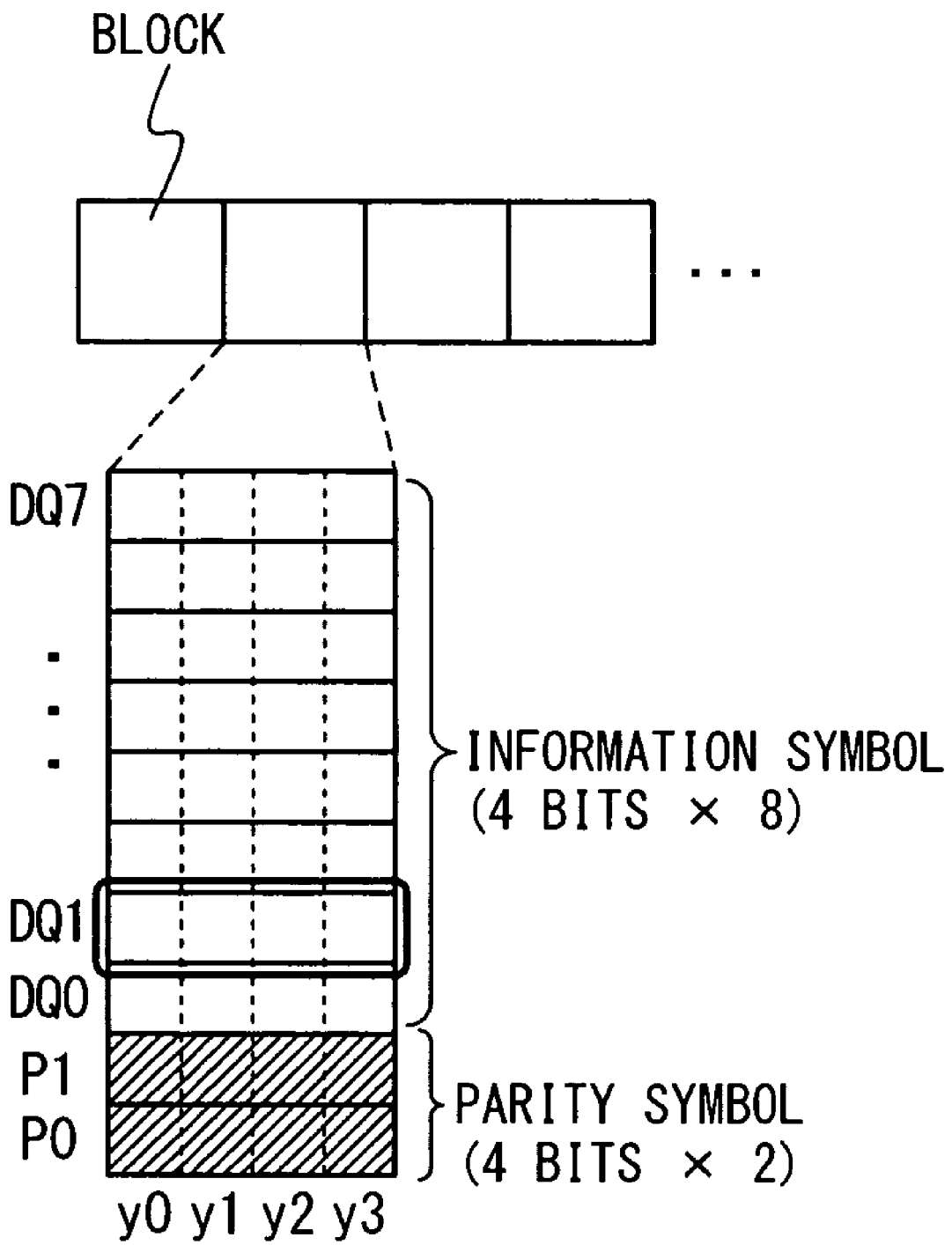
FIG. 5 is a conceptual diagram showing a code format that is used for an error correction in the MRAM according to a first exemplary embodiment of the present invention.

FIG. 5 is a conceptual diagram showing a code format that is used in the error correction in the MRAM of this exemplary embodiment. It should be noted that the format shown in FIG. 5 does not show the physical arrangement of the memory cells and this only shows the logical configuration of the data stored in the MRAM.

In this exemplary embodiment, the (10, 8) Reed-Solomon code is used. That is, each block is composed of 8 information symbols and 2 parity symbols. Each of the information symbol and the parity symbol is composed of 4 bits. That is, in this exemplary embodiment, the parity bit of 8 bits is added to 32 data bits. In the (10, 8) Reed-Solomon code, the error correction of one symbol is possible. In the one symbol, irrespectively of the number of erroneous bits, it is possible to carry out the error correction, and to carry out even the correction of a burst error.

One main subject of the MRAM according to the first exemplary embodiment is to optimize the assignment of the information symbols and the parity symbols to the memory array so that improve the accuracy of the determination of whether a data error is in the data cell or the reference cell is improved, and the data correction can be carried out when the error is in the reference cell. The MRAM according to the first exemplary embodiment will be described below in detail.

Figure 1:
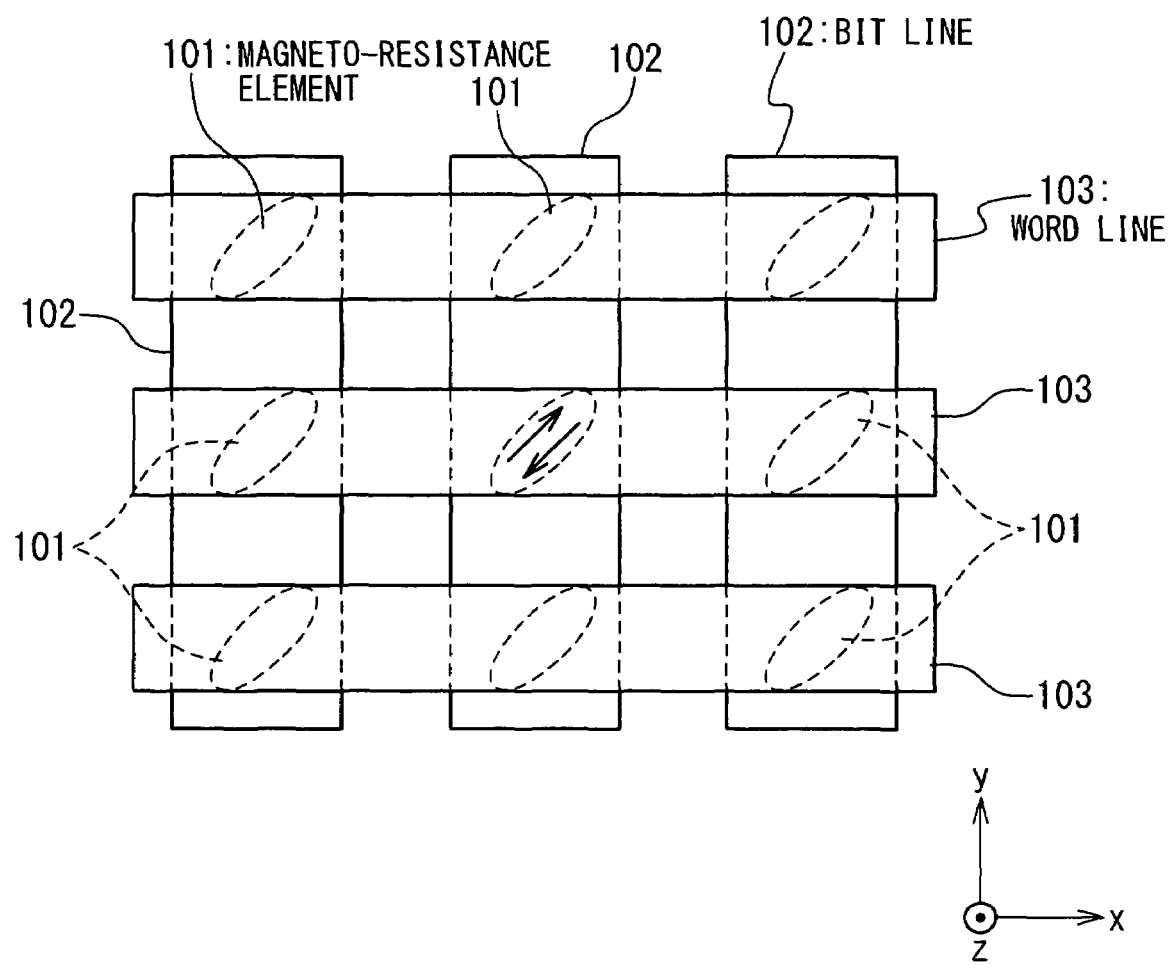
FIG. 1 is a plan diagram showing a typical structure of an MRAM employing a toggle write.
Figure 2:
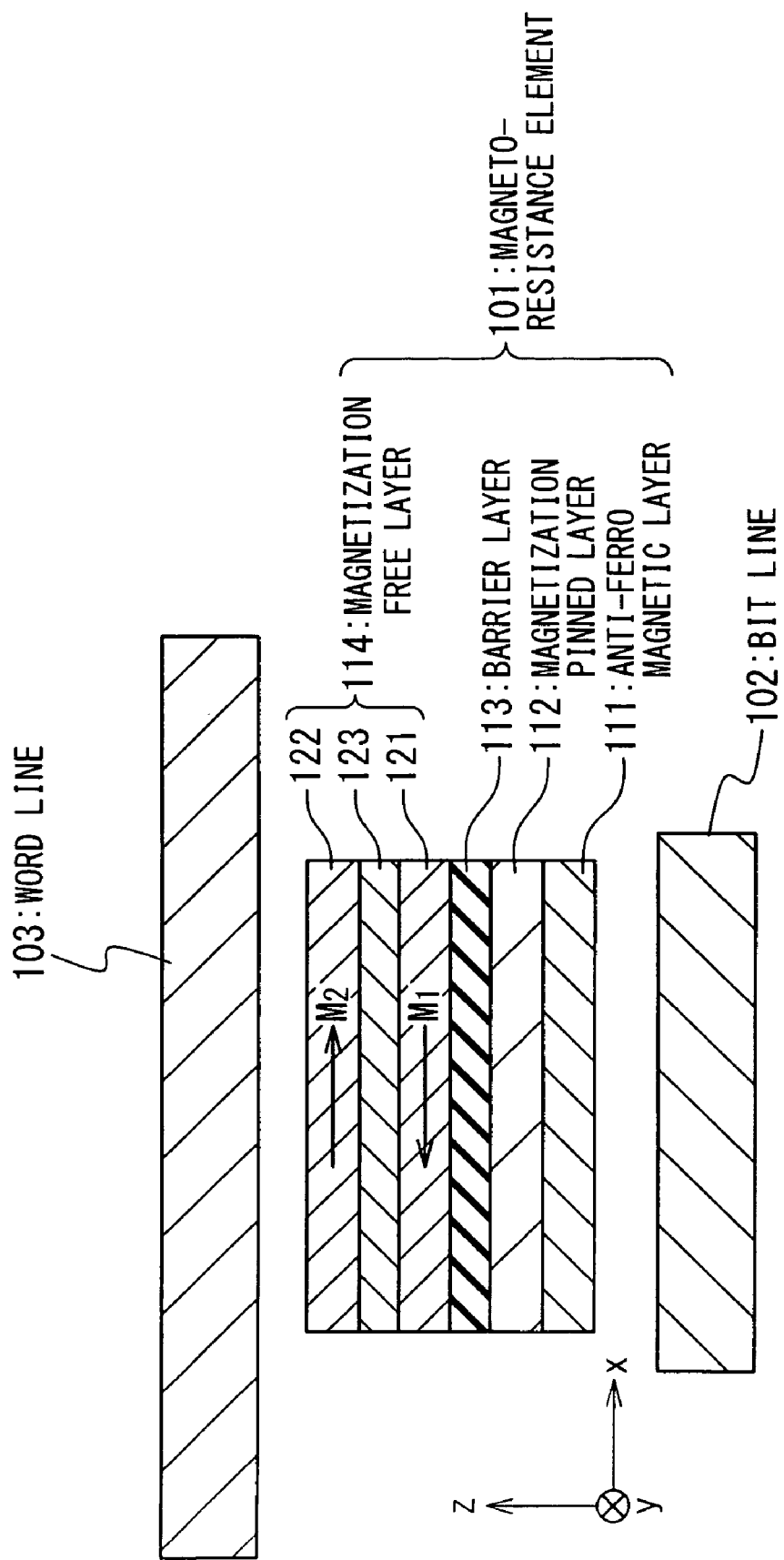
FIG. 2 is a sectional diagram showing the structure of the MRAM employing the toggle write.
Figure 3:
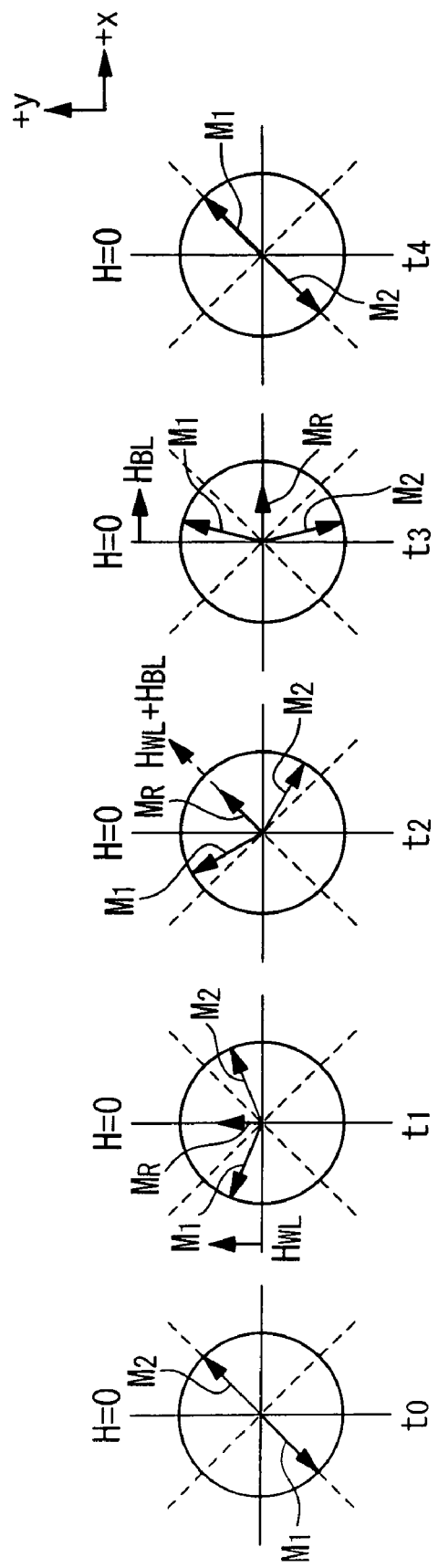
FIG. 3 is a conceptual diagram showing a procedure of a toggle write.
Figure 4:
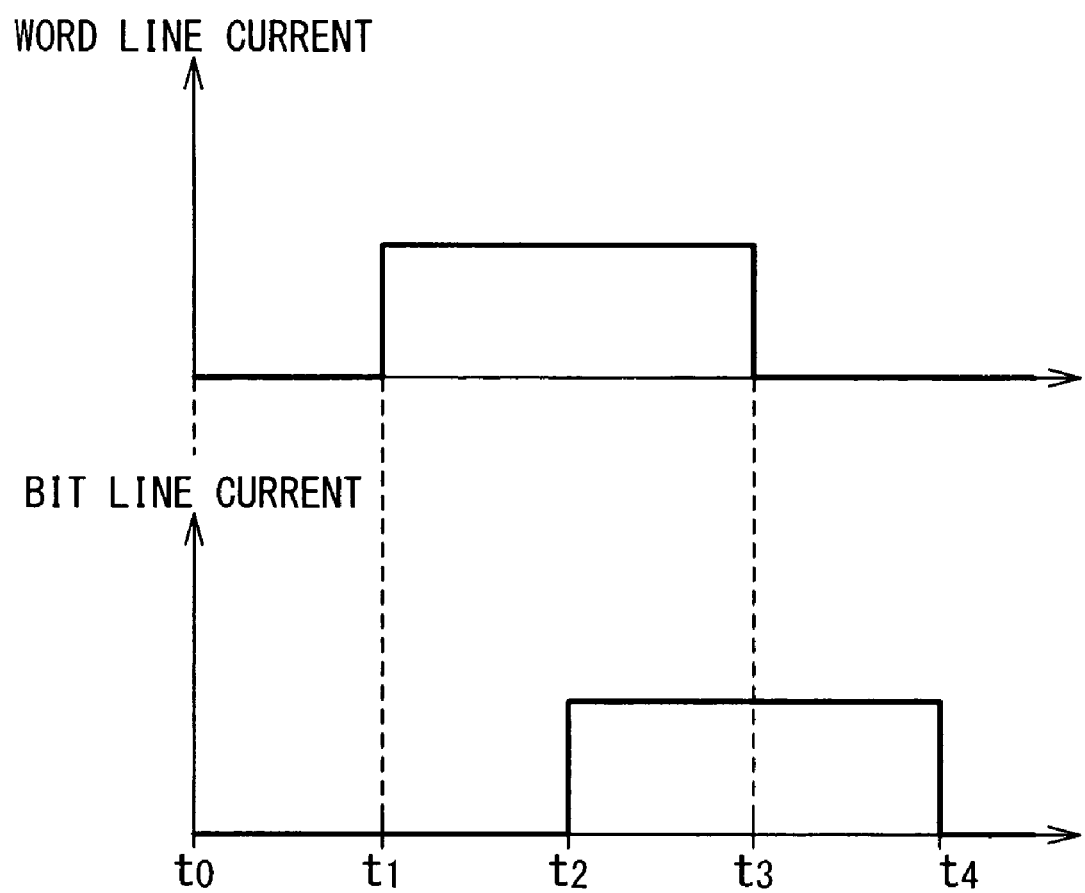
FIG. 4 is a diagram showing the waveforms of the currents supplied through a word line and a bit line in the toggle write.

FIG. 6 is a block diagram showing the configuration of an MRAM 10 according to the first exemplary embodiment of the present invention. The MRAM 10 has a plurality of memory arrays, each of which includes memory cells arranged in a matrix and having magneto-resistance elements. The structure of the magneto-resistance element used for the memory cell is similar to the magneto-resistance element of FIG. 1.

The memory array of the MRAM 10 has data arrays $1_0$ to $1_7$ and parity arrays $2_0$ and $2_1$ as two kinds. Hereinafter, when they are not distinguished, the data arrays $1_0$ to $1_7$ are collectively referred to as data arrays 1, and the parity arrays $2_0$ and $2_1$ are referred to as parity arrays 2. The data array 1 is used to store the information symbols, and the parity array 2 is used to store the parity symbols. The data arrays $1_0$ to $1_7$ are related to data input/output lines DQ0 to DQ7 of the MRAM 10, respectively. When the data is written, the information symbols are configured from write data supplied to the data input/output lines DQ0 to DQ7 and stored in the data arrays $1_0$ to $1_7$. On the other hand, the parity symbols are configured from the information symbols and stored in the parity arrays $2_0$ and $2_1$.

The accesses to the data array 1 and the parity array 2 are carried out by using a peripheral circuit, specifically, a row decoder 3, a column decoder 4, a write/read circuit 5 and a controller 6. The row decoder 3 and the column decoder 4 are used to select one memory cell to be accessed. The write/read circuit 5 carries out a data write operation and a data read operation to the selected memory cell. In this exemplary embodiment, the foregoing toggle write is used in the data write operation. The controller 6 has a function of controlling the row decoder 3, the column decoder 4 and the write/read circuit 5. The controller 6 further has a function of carrying out various operations for the error correction such as the Reed-Solomon coding and the error detection.

Figure 8A:
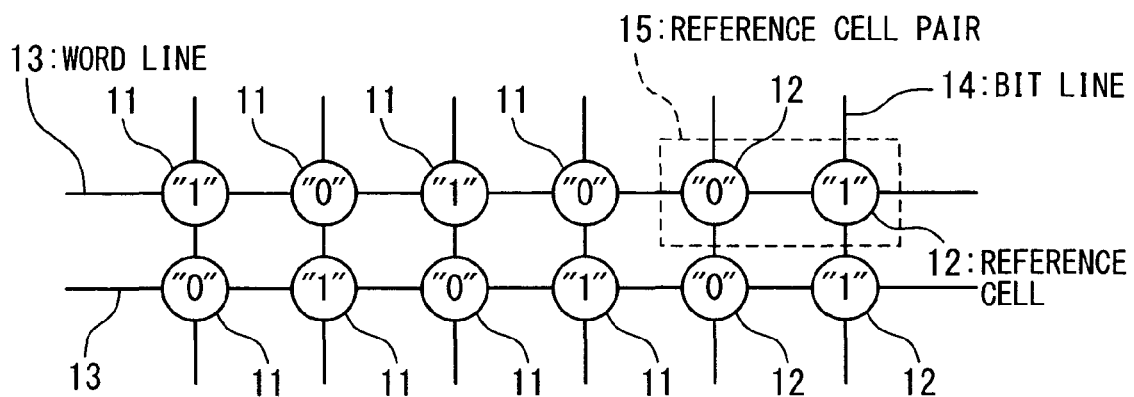
FIG. 8A is a detail diagram showing the configuration of the data array (the parity array) in the first exemplary embodiment.
Figure 8B:
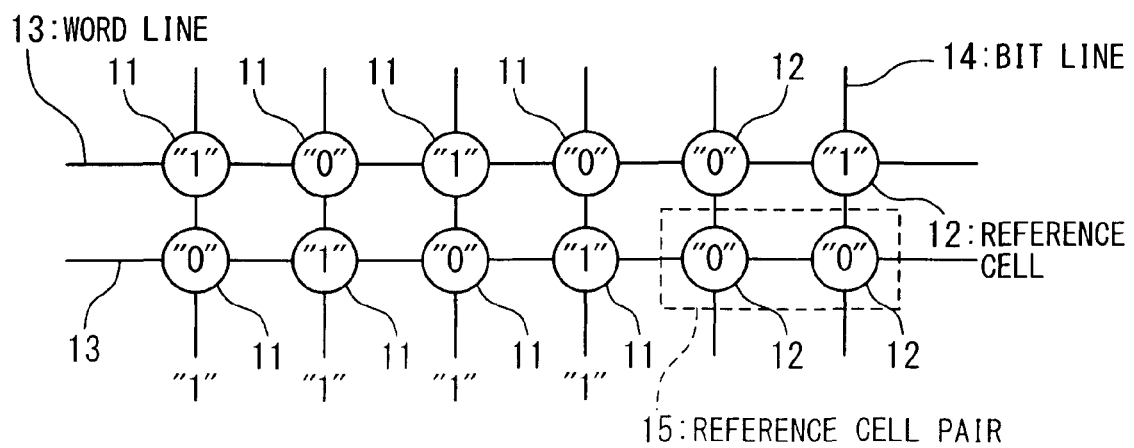
FIG. 8B is a diagram showing the operation of the MRAM when an erroneous data is written in a reference cell.

FIG. 7 is a block diagram showing the configuration of the MRAM 10 in this exemplary embodiment and shows the configurations of one data array 1 (or parity array 2) and a portion of the peripheral circuit corresponding to it. The memory cells are arranged in the data array 1 and the parity array 2 as data cells 11 and reference cells 12. The reference cells 12 are arranged in two columns. As shown in FIGS. 8A and 8B, the data cells 11 and the reference cells 12 are arranged at positions where word lines 13 and bit lines 14 intersect.

The two reference cells 12 located on one row of the memory cells (namely, connected to the same word line 13) configure a reference cell pair 15. Data complementary to each other are written into the two reference cells 12 of one reference cell pair 15. When a data is read from one data cell 11, currents are supplied to the two reference cells 12 located on the same row as the data cell 11, and a reference signal is generated from those currents. This reference signal is generated to have a signal level corresponding to a middle value between the data "1" and the data "0". The data in the data cell 11 is determined by comparing the reference signal and a data signal generated by the current flowing through the data cell 11.

The fact that one of the two reference cells 12 in the reference cell pair 15 holds the data "0" and the other holds the data "1" is important in order to correctly carry out a read operation from the data cell 11. As shown in FIG. 8B, when both of the reference cells 12 in a certain reference cell pair 15 holds the data "0", the data stored in any of the corresponding data cells 11 is easily determined to be the data "1". In this case, a burst error is easily generated.

Referring to FIG. 7 again, the write/read circuit 5 contains a write circuit 16 and a sense amplifier 17. The write circuit 16 generates a write current to reverse the data stored in the data cell 11 and the reference cell 12 in response to a toggle enable signal supplied by the controller 6. As the toggle enable signal, there are two kinds of signal. One is a data cell toggle enable signal, and the other is a reference cell toggle enable signal. When the data cell toggle enable signal is activated, the write circuit 16 generates the write current to reverse the data in the data cell 11. Similarly, when the reference cell toggle enable signal is activated, the write circuit 16 generates the write current to reverse the data in the reference cell 12. The sense amplifier 17 determines the data in the selected memory cell to generate an output data and outputs it to the controller 6.

The controller 6 contains an address/mode controller 21, a data control section 22 and an ECC circuit 23. The address/mode control section 21 generates various internal control signals in response to an address input and a command input. The internal control signals are used to control the row decoder 3, the column decoder 4, the write circuit 16 and the sense amplifier 17. The ECC circuit 23 carries out an operation for the error correction. The ECC circuit 23 contains an encoder 24 for carrying out an error correction encoding and a decoder 25 carrying out a decoding and an error detection. The data control section 22 controls the data write operation into the memory array 1 and the data read operation from the memory array 1. Specifically, the data control section 22 receives a read data (on which the error correction has been carried out if necessity) from the decoder 25 to output to the data input/output lines DQ0 to DQ7. Moreover, the data control section 22 generates the data cell toggle enable signal and the reference cell toggle enable signal to supply to the write circuit 16. When the data cell toggle enable signal and the reference cell toggle enable signal are generated, (1) the output data received from the sense amplifier 17, (2) the read data which is received from the decoder 25 and whose error is corrected and (3) the write data received from the data input/output lines DQ0 to DQ7 are used.

[Assignment of Information Symbol and Parity Symbol]

With reference to FIG. 9A, one feature of the MRAM in this exemplary embodiment lies in an assigning method of information symbols and parity symbols to the data array 1 and the parity array 2. In the MRAM in this exemplary embodiment, the assignment to the data array 1 and parity array 2 of the information symbol and parity symbol is determined such that 8 information symbols and 2 parity symbols in one block are related to the reference cells 12 different from each other. That is, the 8 information symbols and 2 parity symbols in the one block are read by using the reference cells 12 different from each other.

Specifically, the 8 information symbols in a certain block are related to the data input/output lines DQ0 to DQ7 different from each other and consequently stored in the different data arrays 1. Hereinafter, the information symbols related to the data input/output lines DQ0 to DQ7 are referred to as information symbols DQ0 to DQ7, respectively. That is, the information symbols DQ0 to DQ7 are stored in the data arrays $1_0$ to $1_7$, respectively. Since the columns of the reference cells 12 are provided in the respective data arrays $1_0$ to $1_7$, the information symbols DQ0 to DQ7 are read by using the different reference cells 12. The 4 data cells 11 storing one information symbol are provided on one row in the data array 1, and the reference cells 12 on the same row are used to read the data from the 4 data cells 11. Thus, the 8 information symbols are read by using the reference cells 12 different from each other.

The column addresses of the data cells 11 which store the information symbols DQ0 to DQ7 in one block are same over the data arrays $1_0$ to $1_7$. For example, the information symbols DQ0 to DQ7 in the block are stored in the data cells 11 specified by a row address X and a column addresses Y0 to Y3. Such a configuration is preferable because the selection of the data cells 11 is simplified.

In addition, the two parity symbols in the block are stored in the different parity arrays 2 in correspondence to the information symbols. Hereinafter, the parity symbols stored in the parity arrays $2_0$ and $2_1$ are referred to as parity symbols $P_0$ and $P_1$. The parity symbols $P_0$ and $P_1$ are respectively stored in the parity arrays $2_0$ and $2_1$ that are prepared apart from the data arrays $1_0$ to $1_7$. Thus, the parity symbols $P_0$ and $P_1$ are different from each other and read by using the reference cells 12 other than the reference cells 12 used to read the information symbols DQ0 to DQ7. The 4 data cells 11 storing a certain parity symbol are provided on the same row as in the data array 1, and the reference cells 12 located on the same row are used when the data are read from the 4 data cells 11.

The advantages of this assigning method are in that can correctly specify whether an error exists in the data cell 11 or the reference cell 12 at a high probability and can specify a correct read data through the error correction to output to an external unit, even when the error exists in any of them. As shown in FIG. 9B, if a data error rate of the memory cell is sufficiently low, the data error of the data cell 11 appears as a single bit error, and if the data error of the reference cell 12 is high, it appears as a burst error of a single symbol. It is possible to correct a suitable one of the data cell 11 and the reference cell 12 correctly at the high probability by correcting a data of the data cell 11 when the single bit error is detected, and by correcting a data in the reference cell 12 when the burst error is detected.

It should be noted that even when a burst error is generated due to a data error in the reference cells 12, a correct read data can be obtained through the error correction. Since an information symbol and a parity symbol in one block are related to the reference cells 12 different from each other, the burst error generated due to the data error in one reference cell 12 appears in a single symbol. In the (10, 8) Reed-Solomon code, the error in one symbol can be corrected. Therefore, as long as the data error is caused in a single reference cell pair 15, it is always possible to correct the symbol and obtain the correct read data.

[Read Operation]

Figure 10:
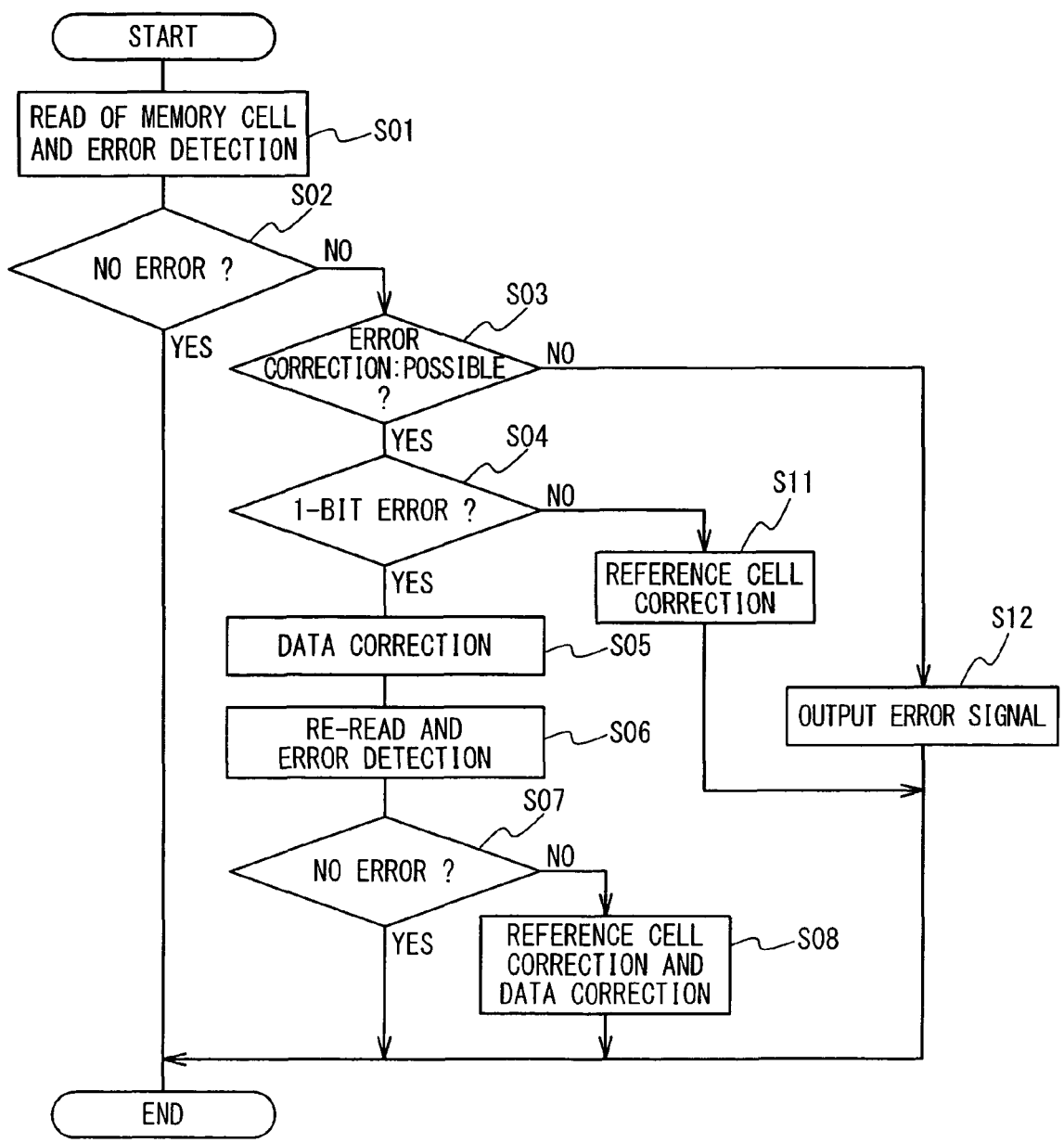
FIG. 10 is a flowchart showing a read operation of the MRAM according to the first exemplary embodiment.

A procedure of the data read operation in which the advantages of the above assigning method are used will be described below. FIG. 10 is a flowchart showing the read operation preferable for the MRAM in this exemplary embodiment. In the read operation of the MRAM in this exemplary embodiment, the data read operation and error detection from the data cell 11 are firstly carried out (Step S01).

The data read operation from the data cell 11 is carried out for each block. When an address input is given, the data cells 11 which store all of the information symbols and parity symbols are selected from the blocks corresponding to the address input. At this time, simultaneously, the reference cells 12 located on the same row as the selected data cells 11 are selected. Subsequently, the data bits are read from the selected data cells 11.

When the data are read from the selected data cells 11, the two reference cells 12 of the reference cell pair 15 located on the same row as the data cells 11 are used. Specifically, an average of currents flowing through the two reference cells 12 and a current flowing through the data cell 11 are compared by the sense amplifier 17, and the data bit of the data cell 11 is determined. In this way, the data bits read out from the data cells 11 are sent to the decoder 25 in the ECC circuit 23, and the error detection is carried out. In this exemplary embodiment, the ECC circuit 23 calculates syndrome from the read data bits and carries out the error detection based on the syndrome.

If any error is not detected, the data bits read out from the data cells are outputted as the output data (Step S02).

On the other hand, if any error is detected, the ECC circuit 23 determines whether or not the error correction is possible (Step S03). If the error correction is determined to be impossible, the ECC circuit 23 outputs an error signal to the external unit (Step S12). The read operation is consequently stopped.

If the error correction is determined to be possible, the ECC circuit 23 calculates the correct read data to output to the external unit. As mentioned above, by using the (10, 8) Reed-Solomon code in this exemplary embodiment, when the data error exists only in the single information symbol, the correct read data can be calculated irrespectively of the number of erroneous bits.

Subsequently, the error in the data cell 11 or reference cell 12 is corrected.

Specifically, if the error detected at the step S01 is not a single bit error (namely, if a plurality of bit errors are detected in one information symbol), under the control of the data control section 22, the data is corrected which has been stored in the reference cell 12 corresponding to the information symbol or the parity symbol in which the data error has been detected (Step S11). If the plurality of bit errors are detected in one information symbol, the data control section 22 activates the reference cell toggle enable signal and allows the write circuit 16 to supply the write current to the reference cell 12. The reference cell 12 is corrected by reversing the data of one of the reference cells 12 of the reference cell pair 15 related to the data error. A case of correcting the reference cell 12 is a case in which both data in the reference cells 12 of a certain reference cell pair 15 are the data "0" or the data "1". Therefore, by reversing the data in one of the reference cells 12 that is arbitrarily selected, the reference cells 12 of the reference cell pair 15 related to the data error can be returned to the state usable for the data read operation. The write currents are supplied to the word line 13 and bit line 14 corresponding to one of the reference cells 12 of the reference cell pair 15 related to the data error, to reverse the data of the one reference cell 12, and thereby the correction of the reference cell 12 is completed. After the reference cell 12 is corrected, the read operation is completed.

On the other hand, if the error detected at the step S01 is a single bit error, the data stored in the data cell 11 is corrected under the control of the ECC circuit 23 (Step S05). That is, of the selected data cells 11, the data in the data cell 11 that is determined to be related to the error is reversed. The reversal of the data is carried out by the toggle write as mentioned above. Specifically, the data control section 22 compares the output data received from the sense amplifier 17 and the data after the error correction, which is received from the decoder 25. If they are different, the data cell toggle enable signal is activated to allow the write circuit 16 to supply the write current to the data cell 11. Moreover, the write currents are supplied to the word line 13 and bit line 14 corresponding to the data cell 11 that is determined to be related to the data error, and the data in the one reference cell 12 is reversed, thereby completing the correction of the reference cell 12.

Subsequently, the data is again read from the selected data cell 11, and the error detection is further carried out by the ECC circuit 23 (Step S06). If any error is not detected (Step S07), the read operation is completed. Basically, the error ought not to be detected at the step S06. This is because the single bit error is caused due to the data error in the data cell 11 in many cases, and the data error is corrected at the step S05.

However, there is a case that the error is detected at the step S06 although its probability is low. This is because in many cases, although a data error is in the reference cell 12, the single bit error is detected at the step S01 depending on the property of the reference cell 12.

Figure 11:
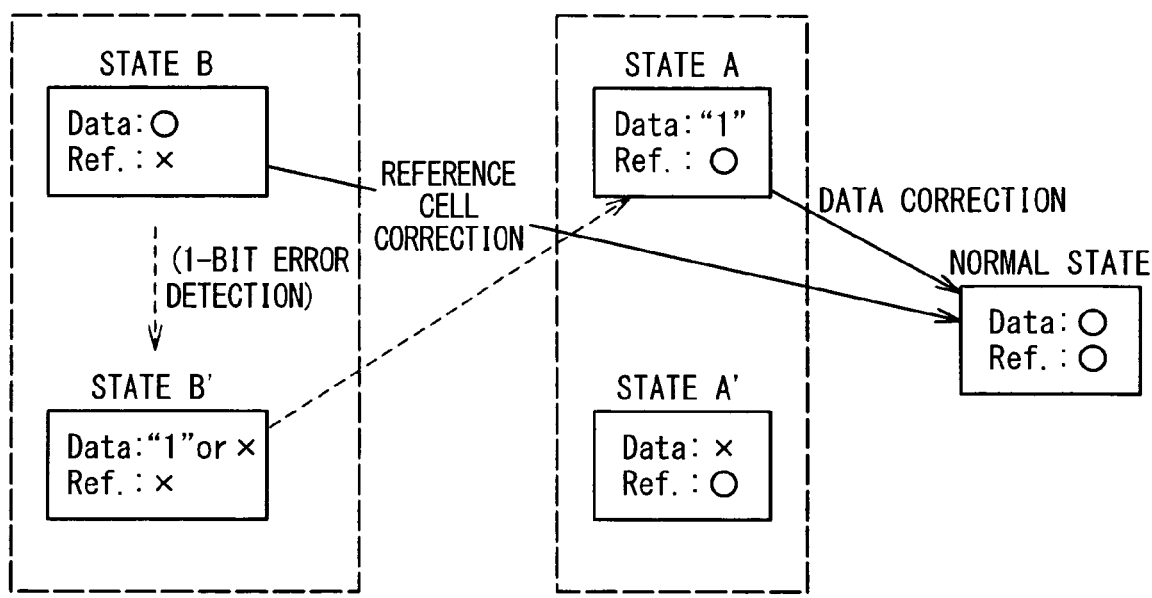
FIG. 11 is a state transition diagram of the MRAM, when the read operation is carried out in the first exemplary embodiment.

If the error is detected at the step S06, the data in the reference cell 12 is corrected, and the data in the data cell 11 is again corrected (Step S08). FIG. 11 is a state transition diagram showing the necessity of correcting both of the data cell 11 and the reference cell 12. In FIG. 11, [Data: ○ (circle)] indicates a state that any data error is not in the data cells 11, and [Data: "1"] indicates a state that a one-bit error is in the data cells 11. Moreover, [Data: X (cross)] indicates that state that a plural-bit error is in the data cells 11. Also, [Ref: ○ (circle)] indicates a state that a data error is not in the reference cells 12, and [Ref: X (cross)] indicates a state that a data error is in the reference cells 12.

Under the condition that a generation probability of a write error and a software error is sufficiently suppressed to be low (specifically, under the condition that it is suppressed to a level to which a data error is only in one cell of the data cells 11 and the reference cells 12 to which the read operation is carried out), if the data error is detected, the MRAM is in one state of the following two states, namely, a state A that the data error is only in the data cells 11, and a state B that the data error is only in the reference cells 12. Whether the MRAM is in the state A or state B can be roughly determined, based on as to whether or not the detected error is the single bit error, although there is a little uncertainty.

If the single bit error is detected, at the step S05, the data cell 11 is corrected under an assumption that the MRAM was in the state A. If the MRAM is actually in the state A, the data cell 11 is corrected, and the MRAM is consequently transited to a normal state (namely, a state in which both data in the data cell 11 and the reference cell 12 are normal).

However, although the single bit error is detected and the data cell 11 is corrected, if the error actually exists in the reference cell 12 (namely, if the MRAM is actually in the state B), the MRAM is transited to a state B' in which both of the data cell 11 and the reference cell 12 are erroneous. If the MRAM is already transited to the state B', there is the necessity of correcting the data in the reference cell 12 and further re-correcting the data in the data cell 11, in order to return the MRAM to the normal state.

The correction of the data in the data cell 11 and reference cell 12 at the step S08 is carried out in accordance with the following procedure. When an error is detected at the step S06, the data control section 22 activates both of the data cell toggle enable signal and the reference cell toggle enable signal and allows the write circuit 16 to supply the write currents to the data cell 11 and the reference cell 12. Moreover, the write current is supplied to the data cell 11 in which the data error is detected at the step S01 and one reference cell 12 of the reference cell pair 15 corresponding to the symbol from which the error is detected, and the data in the data cell 11 and the reference cell 12 are corrected. It should be noted that the corrections of the data cell 11 and the reference cell 12 are carried out at the same time. The fact that the corrections of the data cell 11 and the reference cell 12 are carried out at the same time is effective to reduce the read cycle (name, the time necessary for the read operation). In this way, the read operation is completed.

According to the above read operation, even if the error exists in any of the data cell 11 and the reference cell 12, the MRAM can be returned to the normal state at the high probability.

[Write Operation]

As mentioned above, in the toggle write, the data read operation is carried out prior to the write operation. Even if the error exists in the read data, when the data in the data cell 11 is erroneous, the error in the data cell 11 is automatically corrected through the write operation. However, when the data in the reference cell 12 is erroneous, the erroneous data is read from the target memory cell in this data read operation. This results in the possibility that the erroneous data is written into the target memory cell. Thus, in the toggle write, even if the data stored in the reference cell 12 is erroneous, it is important to be able to correctly write the data. In this exemplary embodiment, when the error exists in the reference cell 12, the reference cell 12 is corrected. After that, the toggle write is carried out on the data cell 11.

Specifically, the write operation is carried out in accordance with the following procedure. When a write address and a write data are given from an external unit, the information symbol, to which the data cell 11 selected based on the write address belongs, and the parity symbol corresponding to the information symbol are read from the data array 1 and the parity array 2 (Step S21). For example, in the example of FIG. 9, when the row address X and the column address Y0 are specified as a write address, the data are read from the data cells 11 in the row address X and the column addresses Y0 to Y3, in both of the data array 1 and the parity array 2. Then, the corresponding information symbol DQ0 to DQ7 and the parity symbols P0 and P1 are outputted from the data array 1 and the parity array 2. The read information symbol DQ0 to DQ7 and the parity symbols P1 and P2 are sent to the decoder 25 in the ECC circuit 23 and also sent to the data buffer 18.

Subsequently, the error detection is carried out on the data read from the decoder 25. If any error is not detected (Step S22), the write data is written in the toggle write (Step S23). The data write operation is carried out in accordance with the following procedure.

At first, by the encoder 24, from the write data given from the external unit and the information symbols DQ0 to DQ7 read at the step S01, the parity symbols P0 and P1 to be newly written are calculated. In detail, when the row address X and the column address Y0 are specified as the write address, the new information symbol DQ0 to DQ7 is generated from the write data of the row address X and the column address Y0 and the data of the column addresses Y1 to Y3 read from the data array 1. Moreover, the parity symbols P0 and P1 are generated from the generated information symbol DQ0 to DQ7.

Figure 16:
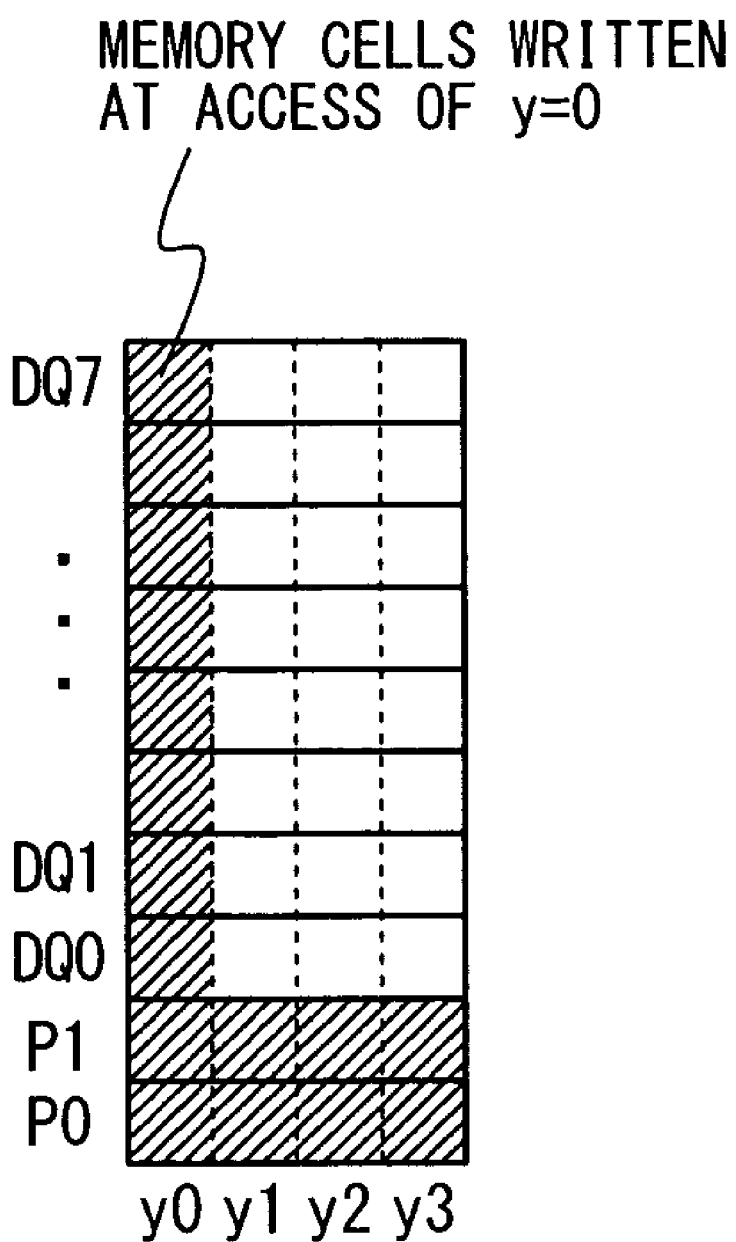
FIG. 16 is a conceptual diagram showing the data cells to which a data write operation is actually carried out, when an address is selected in the write operation.

Subsequently, the write data given from the external unit and the parity symbols P0 and P1 are written by the toggle write. For example, as shown in FIG. 16, when the row address X and the column address Y0 are specified as the write address, the write data of the row address X and the column address Y0 and the bits corresponding to the row address X and column addresses Y0 to Y3 of the parity symbols P0 and P1 are written into the corresponding data cells 11 in the data array 1 and the parity array 2.

With reference to FIG. 7, the data write operation to the data cell 11 is carried out in response to the coincidence/non-coincidence between the output data outputted by the sense amplifier 17 and the encoded data outputted by the encoder 24. The data control section 22 activates the data cell toggle enable signal if the output data outputted by the sense amplifier 17 and the encoded data outputted by the encoder 24 are not coincident, and allows the write circuit 16 to supply the write current to the data cell 11. Moreover, the write current is supplied to the data cell 11 targeted for the write operation. Thus, the data in the data cell 11 is reversed in the toggle write. If the output data outputted by the sense amplifier 17 and the encoded data outputted by the encoder 24 are coincident, the data in the data cell 11 targeted for the write operation is not required to be reversed. In this case, the data cell toggle enable signal is deactivated, and the toggle write is not done.

On the other hand, if the error is detected at the step S21, the ECC circuit 23 determines whether or not the error correction is possible (Step S24). If determining that the error correction is impossible, the ECC circuit 23 outputs an error signal to the external unit (Step S32). The write operation is consequently stopped.

If determining that the error correction is possible, the process is carried out which is different on the basis of the kind of the detected error. If the detected error is not the single bit error (namely, if a plurality of bit errors are detected in one information symbol), under the control of the data control section 22, the correction of the data stored in the reference cell 12 corresponding to the information symbol or parity symbol from which the data error is detected and the data write operation to the data cell 11 targeted for the write operation are carried out at the same time (Step S31). The fact that the correction of the reference cell 12 and the write operation into the data cell 11 are carried out at the same time is effective in order to reduce a write cycle (namely, the time necessary for the write operation).

Specifically, the data control section 22 activates the reference cell toggle enable signal and allows the supply of the write current to the reference cell 12. Thus, the data in the reference cell 12 is corrected. Moreover, the data control section 22 uses the read data after the error correction that is generated by the decoder 25 and the encoded data generated by the encoder 24 to carry out a data write into the data cell 11. If the read data after the error correction and the encoded data are not coincident, the data control section 22 activates the data cell toggle enable signal and allows the supply of the write current to the data cell 11. Moreover, the write current is supplied to the data cell 11 targeted for the write operation. Therefore, the data in the data cell 11 is reversed in the toggle write. If the read data after the error correction that is generated by the decoder 25 and the encoded data outputted by the encoder 24 are coincident, the toggle write is not carried out.

It should be noted that unlike the data write operation at the step S23, the data used in the data write operation is not the output data outputted by the sense amplifier 17 and it is the read data after the error correction which is generated by the decoder 25. If an error exists in the reference cell 12, the output data outputted by the sense amplifier 17 differs from the data actually stored in the data cell 11. Thus, if the error exists in the reference cell 12, the fact that the output data outputted by the sense amplifier 17 is used in the data write operation leads the result that the erroneous data is written into the data cell 11. In this exemplary embodiment, the read data after the error correction that is generated by the decoder 25 (this read data coincides with the data actually stored in the 11) is used in the data write operation. Thus, the correct data write operation can be attained.

When the write operation into the data cell 11 and the correction of the reference cell 12 are ended, the read operation is completed.

On the other hand, if the detected error is the single bit error (Step S25), similarly to the same procedure as the step S23, the write data given from the external unit and the parity symbols P0 and P1 are written into the corresponding data cell 11 in the toggle write (Step S26). If the output data outputted by the sense amplifier 17 and the encoded data outputted by the encoder 24 are not coincident, the data control section 22 activates the data cell toggle enable signal and allows the write circuit 16 to supply the write current to the data cell 11. Moreover, the write current is supplied to the data cell 11 targeted for the write operation. Thus, the data in the data cell 11 is reversed in the toggle write. If the output data outputted by the sense amplifier 17 and the encoded data outputted by the encoder 24 are coincident, the toggle write is not carried out.

Next, the data is again read from the data cell 11, and the error detection is carried out by the ECC circuit 23 (Step S27). If any error is not detected (Step S28), the write operation is completed. Basically, the error ought not to be detected at the step S28. This is because the single bit error is caused due to the data error in the data cell 11 in many cases, and the data error is corrected by the data write operation at the step S26.

Figure 13:
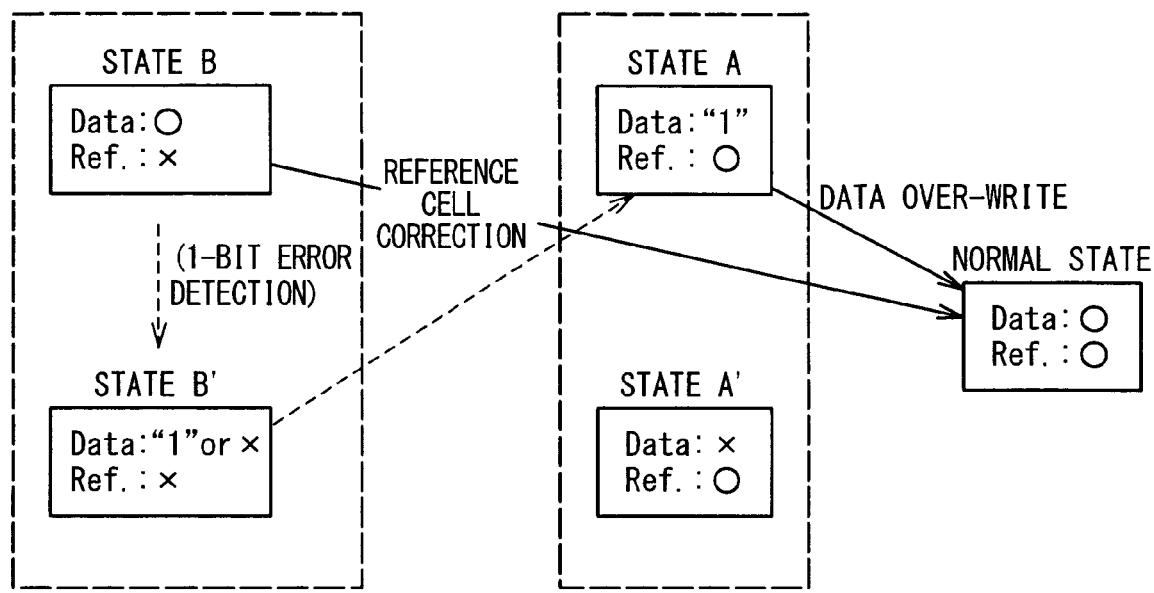
FIG. 13 is a state transition diagram of the MRAM, when the write operation is carried out in the first exemplary embodiment.

However, there is a case that the error is detected at the step S28 although its probability is low. Similarly to the case of the read operation, this is because the single bit error is detected at the step S21, depending on the property of the reference cell 12, although the reference cell 12 has the data error. As shown in FIG. 13, if the single bit error is detected, the data write operation is carried out on the data cell 11 at the step S26, under the assumption that the MRAM was in the state A. If the MRAM is actually in the state A, the MRAM is transited to the normal state through the data write operation to the data cell 11, (namely, the state in which both data in the data cell 11 and reference cell 12 are normal).

However, although the single bit error is detected and the data write operation to the data cell 11 is carried out, if the error actually exists in the reference cell 12 (namely, if the MRAM is actually in the state B), the MRAM is transited to the state B' in which both of the data cell 11 and the reference cell 12 are erroneous. If the MRAM is already transited to the state B', there is the necessity of correcting the data in the reference cell 12 and further correcting the data in the data cell 11 in order to return the MRAM to the normal state.

Figure 12:
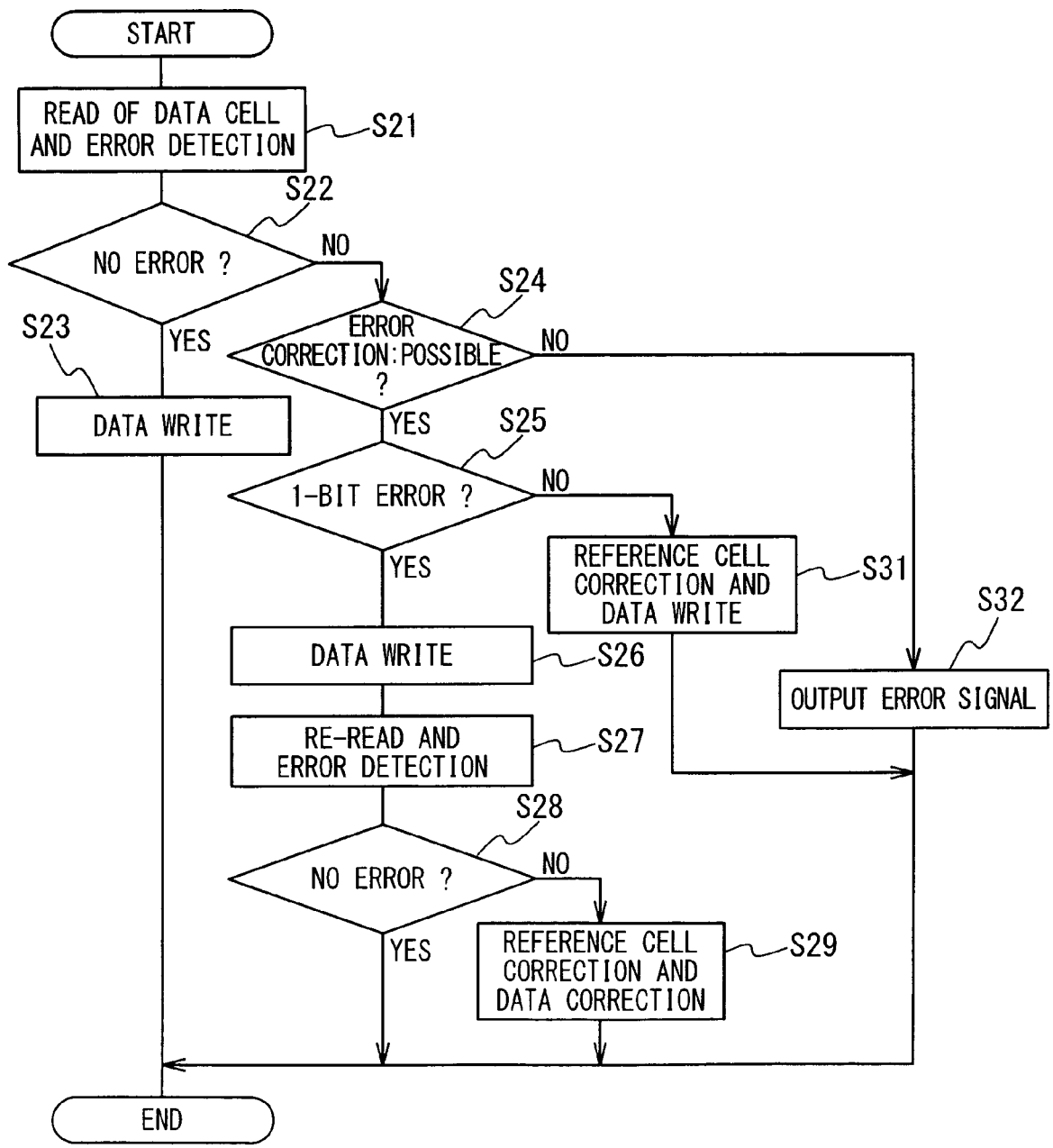
FIG. 12 is a flowchart showing a write operation of the MRAM according to the first exemplary embodiment.

Again in FIG. 12, if the error is detected at the step S27, the correction of the reference cell 12 in the reference cell pair 15 that is used to read and the correction of the data in the data cell 11 are carried out at the same time (Step S29). It is effective to reduce the writing cycle (namely, the time necessary for the write operation) that the correction of the reference cell 12 and the correction of the data in the data cell 11 are carried out at the same time.

Specifically, the data control section 22 activates the reference cell toggle enable signal and allows the supply of the write current to the reference cell 12. Thus, the data in the reference cell 12 is corrected. Moreover, the data control section 22 activates the data cell toggle enable signal and allows the supply of the write current to the data cell 11 having the one-bit error bit detected at the steps S21 and S25. Here, it is not allowed to supply the write current to the data cell having the bit other than the error bit detected at the step S25. The write current is supplied to the data cell 11 targeted for the write operation. Thus, the data in the data cell 11 is reversed in the toggle write. It should be noted that as mentioned above, in the data correction at the step S29, the data cell having the error bit detected at the steps S21 and S25 is unconditionally toggle-operated. This is because, although it is originally the information symbol without any error, since the write operation is carried out at the step S26 on the basis of the erroneous read data including the one-bit error bit, there is the necessity of rewriting back to the original correct data by toggle-operating the data cell having the error bit again.

According to the foregoing write operation, even if the error exists in the reference cell 12, the correct data write operation can be carried out, which can return the MRAM to the normal state at the high probability.

Second Exemplary Embodiment

One subject of the read operation in the MRAM according to the first exemplary embodiment lies in the necessity of carrying out the data read operation again after the correction (Step S05) of the data cell 11, in order to improve the certainness of the error correction, as shown in FIG. 10. The re-execution of the data read operation is not preferable because of the increase in the read cycle. The second exemplary embodiment provides the architecture of the MRAM to remove the necessity of the data read operation of the correction of the data cell 11.

Figure 14A:
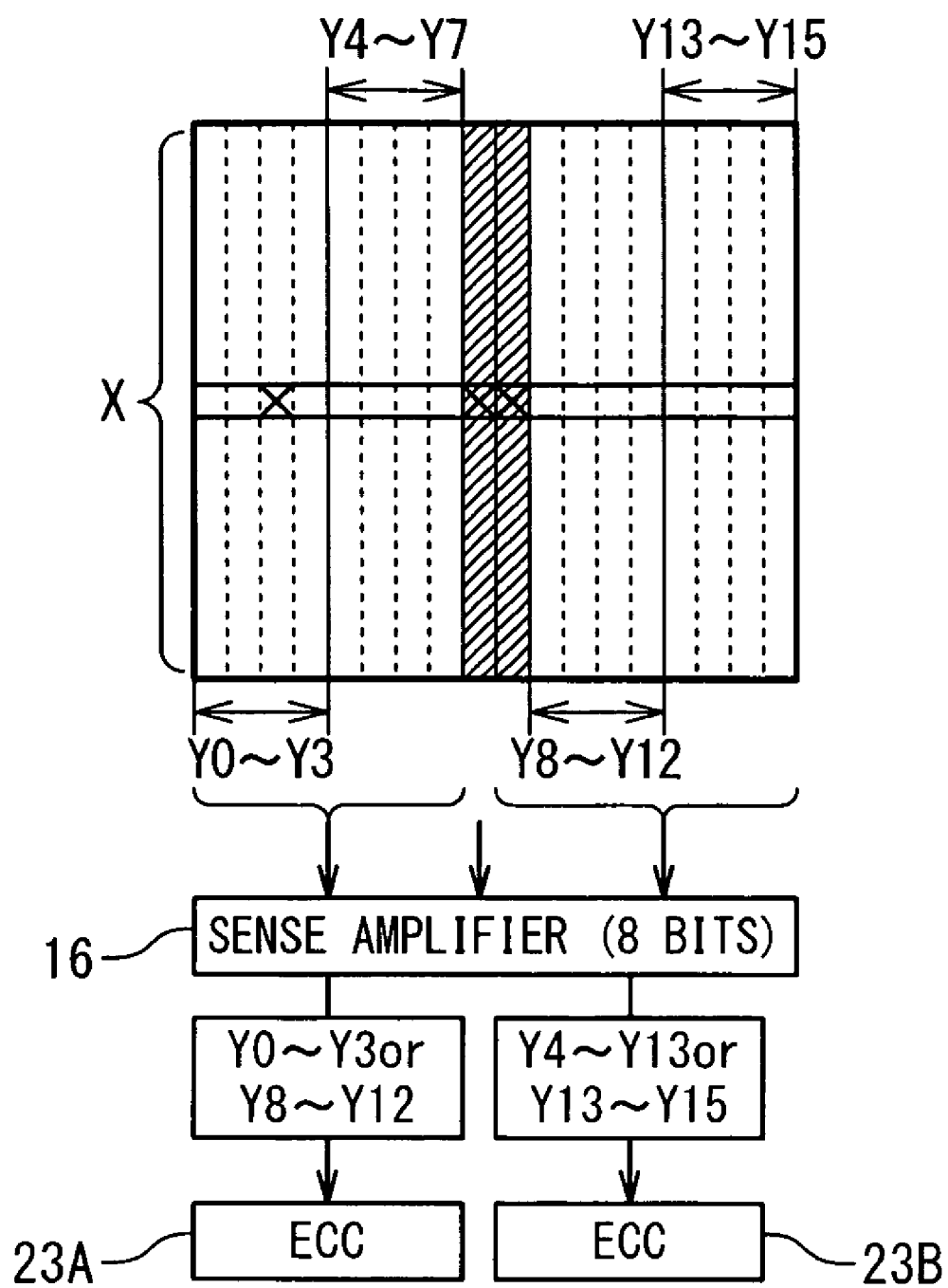
FIG. 14A is a diagram partially showing the configuration of the MRAM according to a second exemplary embodiment of the present invention.

FIG. 14A is a diagram partially showing the configuration of the MRAM according to the second exemplary embodiment of the present invention. Two ECC circuits 23A and 23B are provided in the controller 6. Each of the ECC circuits 23A and 23B has a function for carrying out the error detection and correction on the data in one block.

In addition, in the MRAM in this exemplary embodiment, the read operation from two blocks is carried out when a read address is specified from external unit. One block is a block corresponding to the read address, and the other block is a block composed of an information symbol of the block, an information symbol read by using the same reference cell as the reference cells used to read the parity symbol, and a parity symbol.

Specifically, the sense amplifiers 17 connected to the data array 1 and the parity array 2 are configured to read two symbols (namely, 8-bit data) at a same time, by using the same reference cell pair 15. As mentioned above, one block is composed of 8 information blocks stored in the data arrays $1_0$ to $1_7$, respectively, and the 2 parity blocks stored in the parity array 2, respectively. Thus, the 2 blocks are read by reading the two symbols of the same address from the data array 1 and the parity array 2, respectively.

For example, when the row address X and the column address Y0 are specified as a read address, in each of the data arrays 1 and the parity arrays 2, a symbol stored in the data cells 11 of the row address X and the column addresses Y0 to Y3 and a symbol stored in the data cells 11 of the row address X and column addresses Y4 to Y6 are read by using the reference cell 12 of the reference cell pair 15 selected in accordance with the row address X. From each of the data array 1 and the parity array 2, the symbol corresponding to the row address X and the column addresses Y0 to Y3 are sent to the ECC circuit 23A, and the symbol corresponding to the row address X and the column addresses Y4 to Y6 are sent to the ECC circuit 23B. The ECC circuits 23A and 23B use the symbols sent thereto, to perform the error detection and error correction on the two blocks.

In the MRAM in the second exemplary embodiment having the foregoing configuration, in order to remove the necessity of the data read operation of the correction of the data cell 11, the data cell 11 and the reference cell 12 are corrected in accordance with the following procedure.

Figure 15:
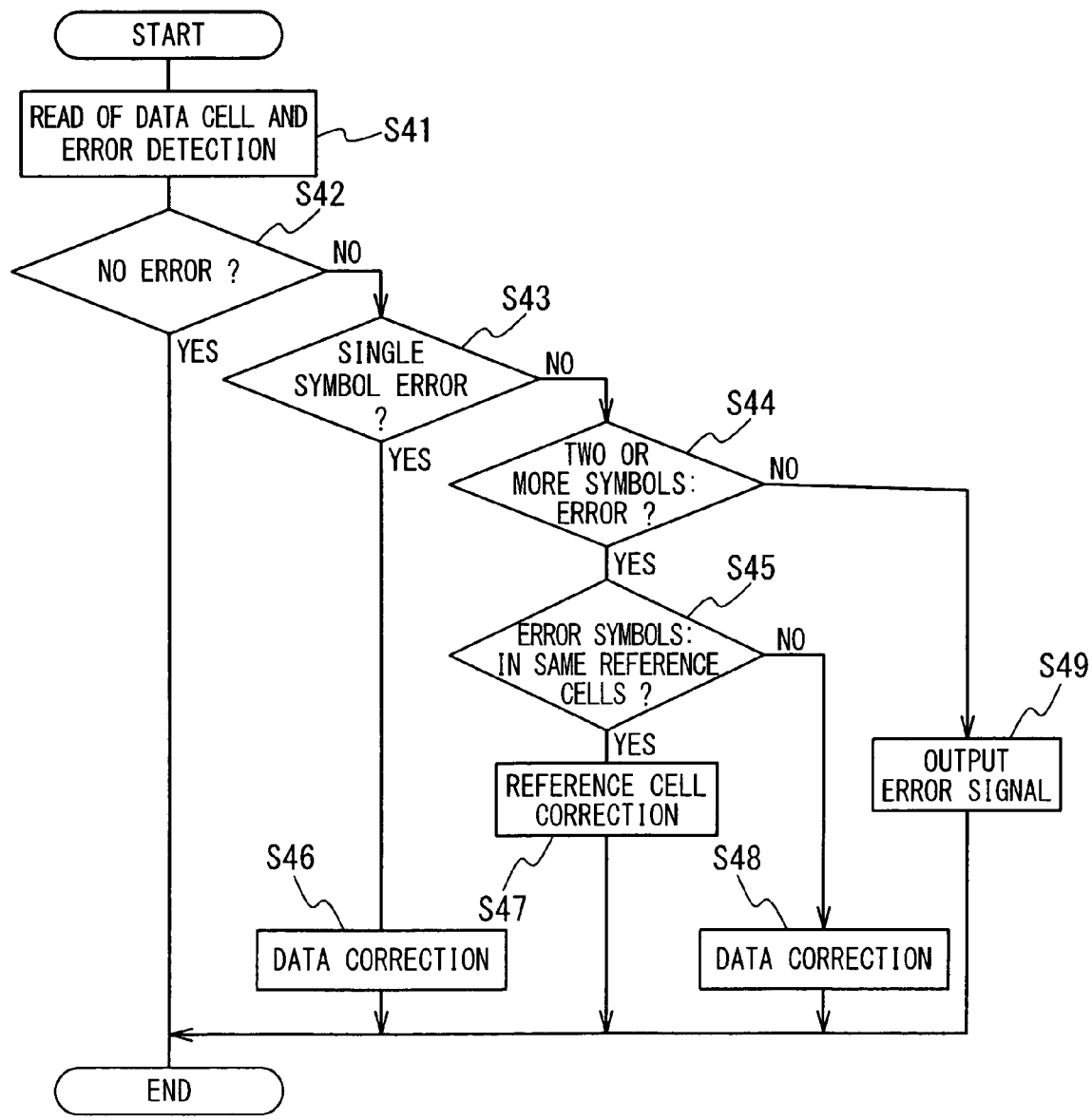
FIG. 15 is a flowchart showing a read operation of the MRAM according to the second exemplary embodiment.

With reference to FIG. 15, the data read operation and the error detection are firstly carried out (Step S41). In the data read operation, as mentioned above, in addition to the block corresponding to the read address, another block is read from the data array 1 and the parity array 2, and the error detection is carried out on the two read blocks.

If any error is not detected, the data read from the data cell 11 that is specified in accordance with the read address is outputted as the read data to the external unit, and the read operation is ended (Step S42).

If any error is detected, the correction of the data cell 11 or the correction of the reference cell 12 is further carried out on the basis of a kind of the error.

Figure 14B:
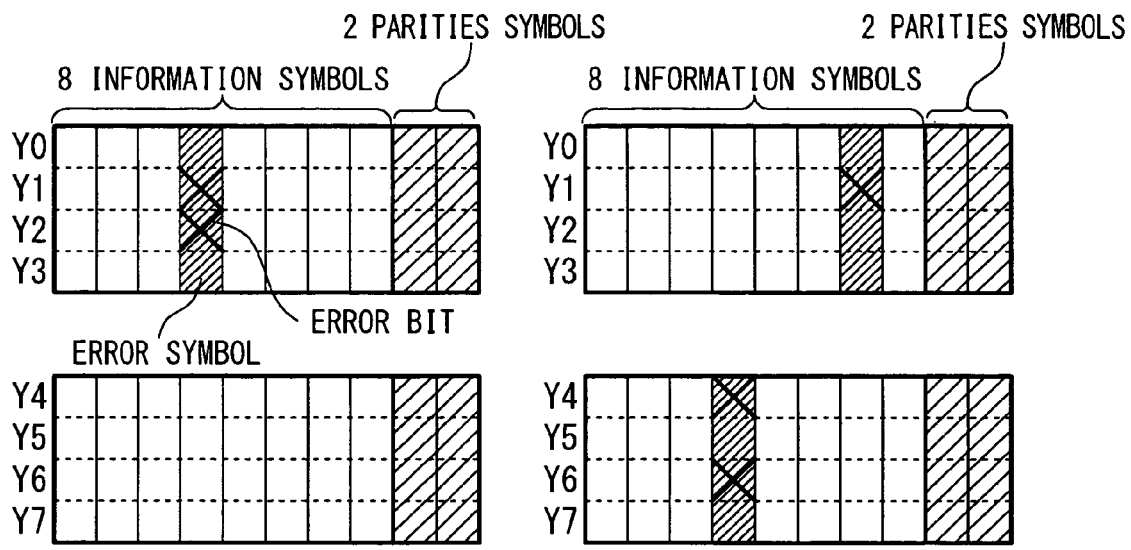
FIG. 14B is a diagram showing a data error in a data cell in the MRAM according to the second exemplary embodiment.

If the error is detected only in one symbol in the two blocks (Step S43), a correct read data is calculated through an error correction, and the calculated correct read data is outputted to the external unit. Moreover, as shown on the left side in FIG. 14B, of the data cells 11 corresponding to the symbols, the data in the data cell 11 from which the data error is detected is corrected (Step S46), and the read operation is ended.

If the errors are detected in the two or more symbols, the error correction is impossible. In this case, an error signal is outputted to stop the read operation (Step S49).

Figure 14C:
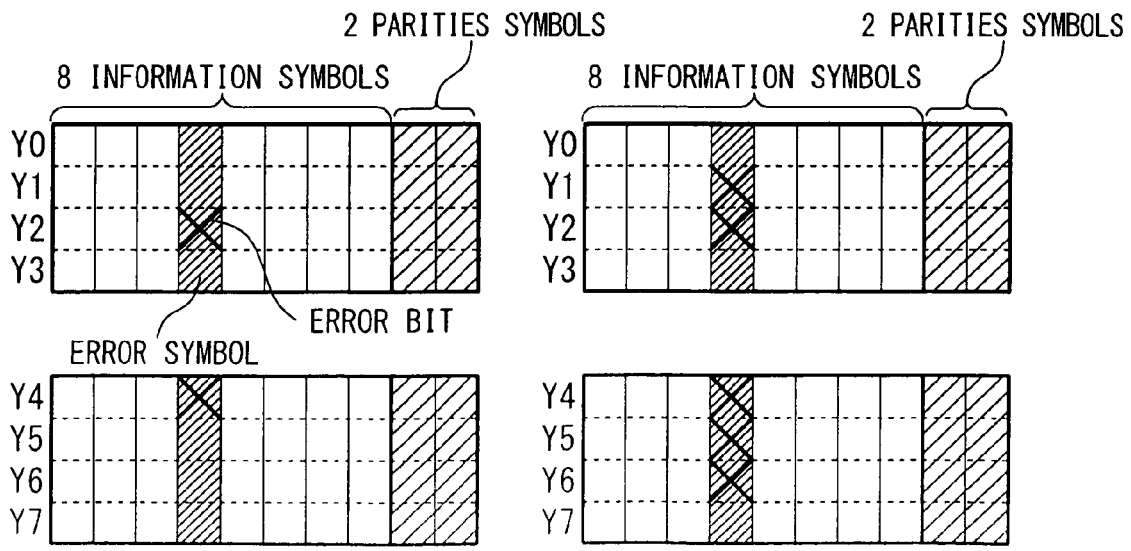
FIG. 14C is a diagram showing a data error in a reference cell in the MRAM according to the second exemplary embodiment.

There is a case other than the above cases, and in such a case, the error is detected for each symbol in each of the two blocks, and the error correction is possible. In this case, after the correct read data that is calculated through the error correction is outputted to the external unit, the suitable memory cells in the data cells 11 and the reference cells 12 are corrected. Specifically, if the two symbols from which the errors are detected correspond to the same reference cell 12 (Step S45), the reference cells 12 are corrected (Step S47) as shown in FIG. 14C. On the other hand, in case of the different reference cells 12, the data cells 11 are corrected as shown on the right side of FIG. 14B (Step S48). When the correction of the data cell 11 or the correction of the reference cell 12 is completed, the read operation is completed.

In the read operation of the MRAM in this exemplary embodiment, even if the data is not read again after the correction of the data cell 11, the data cell 11 and the reference cell 12 can be correctly corrected at a high probability. If the error exists in the certain reference cell 12, the errors are generated in the two symbols corresponding to the reference cells 12 at a high probability. There is not substantially possibility that the error is generated only in one symbol. Thus, the detected data error could be determined to be the error in the data cell 11, in case other than the case that the two symbols from which the errors are detected use the same reference cell 12. Therefore, in the read operation of the MRAM in this exemplary embodiment, the data cell 11 and the reference cell 12 can be correctly corrected at a high probability, even if any verification is not carried out of whether or not the correction is correct, after the correction of the data cell 11.

It should be noted that in the MRAM of FIG. 13, the two ECC circuits are provided in the controller 6. However, the three or more ECC circuits can be provided in the controller 6 so that the three or more blocks may be read at a same time. In this case, the reference cell 12 is corrected, when the errors are detected in the two or more symbols corresponding to the same reference cell 12, and the data cell 11 is corrected, otherwise.

Third Exemplary Embodiment

In the MRAM in the first exemplary embodiment, when the data is written, the write current is intensively supplied to the parity array 2. For example, with reference to FIG. 16, when the data in an address (for example, the column address Y0) is rewritten, one-bit write corresponding to the address is carried out in each of the data arrays 1. However, since the entire parity symbol is required to be rewritten, 4 bits are required to be written in each of the parity array 2. This increases the write current to be supplied to the parity array 2, as compared with the write current to be supplied to the data array 1. Such a non-uniformity in the write current leads to a variation in a local power supply voltage. When the symbol is composed of further many bits, the non-uniformity in the write current is further increased. Such non-uniformity in the write current is not preferable because of the fear of the reduction in the reliability of the operation of the MRAM. The third exemplary embodiment provides the architecture of the MRAM in order to remove the non-uniformity in the write current.

Figure 17:
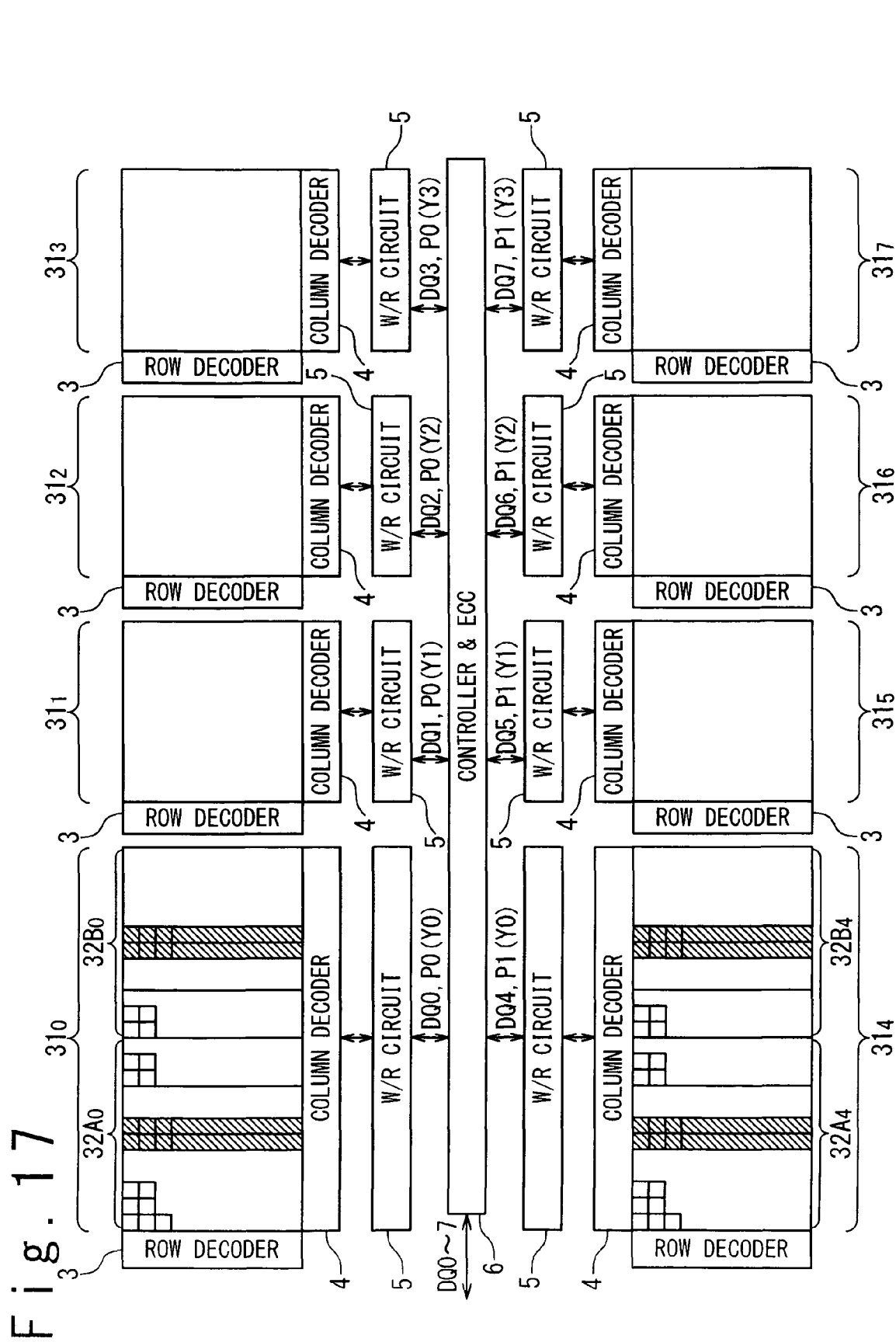
FIG. 17 is a block diagram showing the configuration of MRAM according to a third exemplary embodiment of the present invention.

FIG. 17 is a block diagram showing the configuration of the MRAM in the third exemplary embodiment. In the MRAM in this exemplary embodiment, bits of the parity symbol are dispersed and stored in memory arrays $31_0$ to $31_7$. The memory arrays $31_0$ to $31_7$ have a same configuration, and they are collectively referred to as a memory array 31 when the discrimination is not required. It should be noted that in FIG. 17, in order to simplify the drawing, only the configurations of the memory arrays $31_0$, $31_4$ are described in detail.

Figure 18:
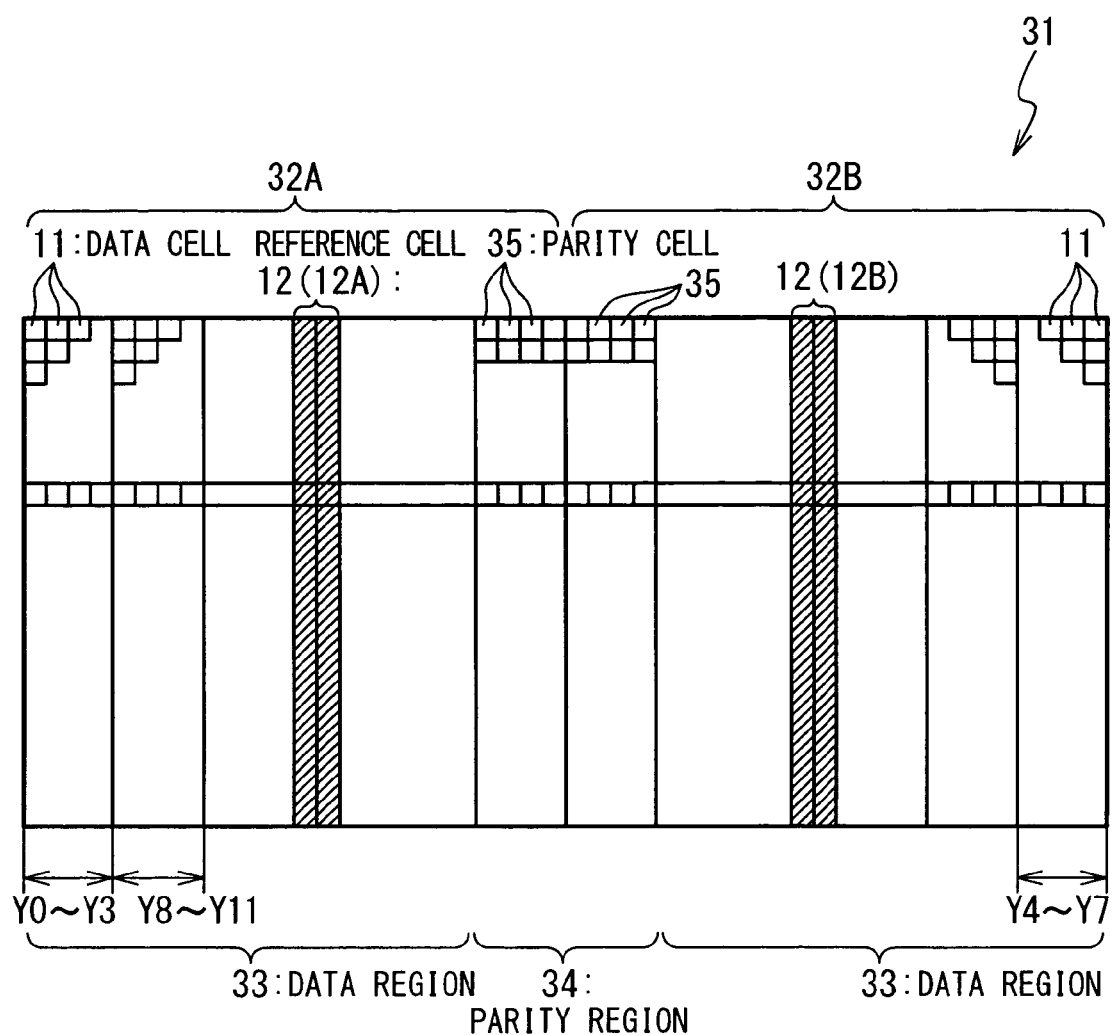
FIG. 18 is a conceptual diagram showing the configuration of a memory array of the MRAM according to the third exemplary embodiment.

Specifically, as shown in FIG. 18, each of the memory arrays 31 is composed of two memory areas 32A and 32B. Each of the memory areas 32A and 32B has a data region 33 and a parity region 34. The data region 33 is a region in which the data cells 11 and the reference cells 12 are arranged. The parity region 34 is a region in which parity cells 35 are arranged as memory cells for storing the parity symbol. The reference cells 12 are arrayed in the two columns in each data region 33 in the memory areas 32A and 32B. The data bits of the data cells 11 and parity cells 35 that are arranged in the memory area 32A are read by using the reference cells 12 (hereinafter, to be referred to as reference cells 12A) arranged in the memory area 32A. The data bits of the data cells 11 and parity cells 35 that are arranged in the memory area 32A are read by using the reference cells 12 (hereinafter, referred to as reference cells 12B) arranged in the memory area 32B.

Figure 19:
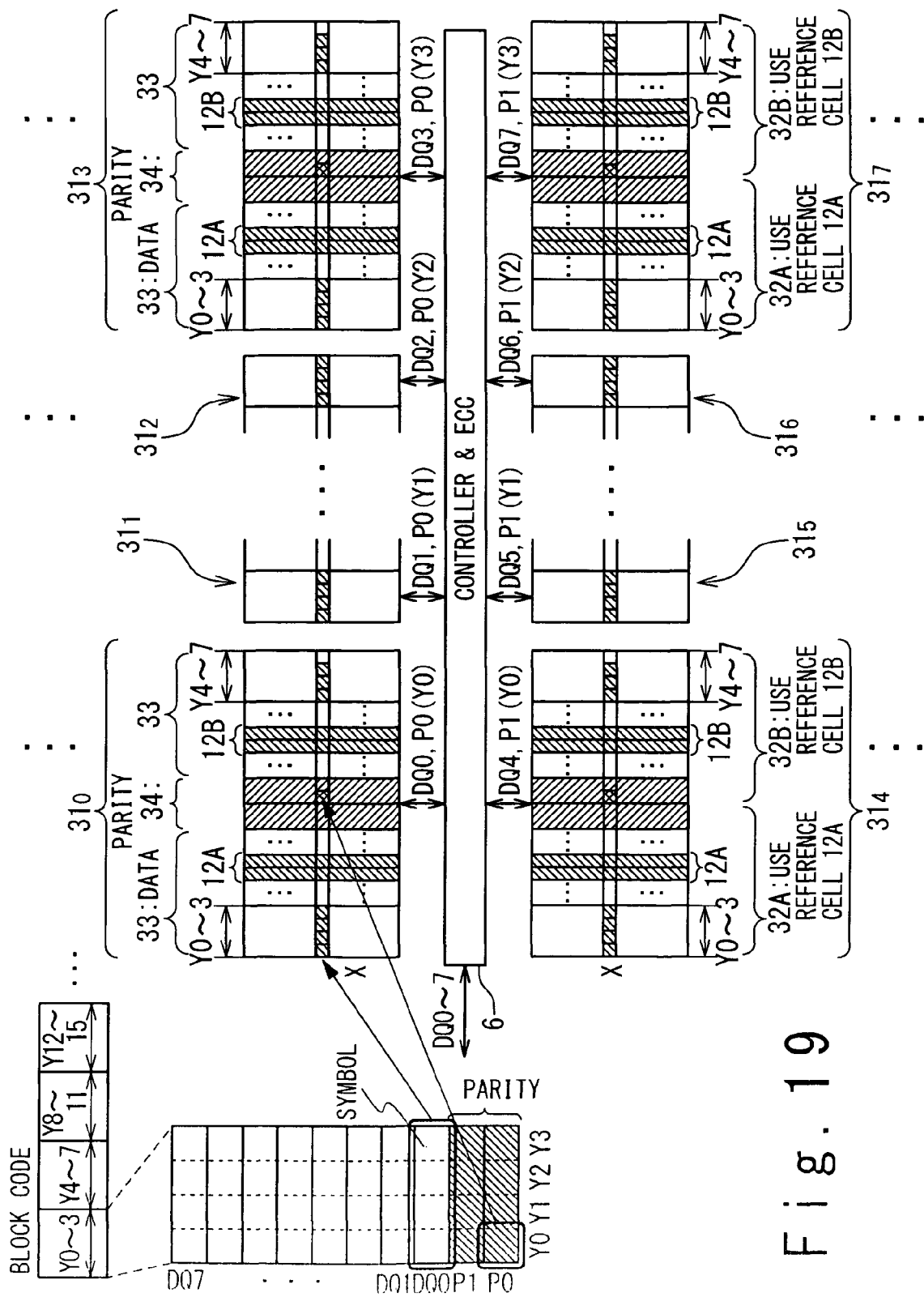
FIG. 19 is a conceptual diagram showing an assigning method of the information symbol and the parity symbol to the memory array.

FIG. 19 is a diagram showing the assigning method to the data array 1 and parity array 2 of the information symbol and parity symbol in the MRAM in this exemplary embodiment. The feature in the assigning method of the information symbol and parity symbol to the MRAM in this exemplary embodiment is in that an information symbol and a parity symbol are assigned to the memory arrays 31 such that 8 symbol bits and 8 parity bits are read out by using the reference cells 12 different from each other.

Specifically, in this exemplary embodiment, the 8 information symbol bits DQ0 to DQ7 in one block are stored in the data regions 33 in the memory arrays $31_0$ to $31_7$, respectively. The data cells 11 storing the 4 bits of each information symbol are arranged on the same row.

On the other hand, bits of the parity symbol are dispersed and stored in the memory arrays $31_0$ to $31_7$. Specifically, the 4 bits of the parity symbol $P_0$ are dispersed and stored in the memory arrays $31_0$ to $31_3$, respectively. On the other hand, the 4 bits of the parity symbol $P_1$ are dispersed and stored in the memory arrays $31_4$ to $31_7$, respectively. The parity cells 35 for storing the bits of the parity symbols are located on a same row (namely, selected at a same time) as the data cells 11 in which the information symbol belonging to a same block is stored. However, they are arranged in the different memory areas 32A and 32B.

For example, the 4 data cells 11 for the column addresses Y0 to Y3 for storing the information symbol DQ0 and the parity cells 35 for the column address Y0 for storing bits of the parity symbol $P_0$ are arranged on a same row of the memory array $31_0$. However, the former is arranged in the memory area 32A, and the latter is arranged in the memory area 32B. As this result, when the data are read from the four data cells 11 in which the information symbol DQ0 is stored, the reference cells 12A arranged in the memory area 32A are used. On the other hand, when the data are read from the parity cells 35 in which the bits corresponding to the column address Y0 of the parity symbol $P_0$ are stored, the reference cells 12B arranged in the memory area 32B are used.

Similarly, the four data cells 11 for the column addresses Y4 to Y6 for storing the information symbol DQ and the parity cells 35 for the column address Y4 for storing the bits of the parity symbol $P_0$ are arranged on a same row of the memory array 31. However, the former is arranged in the memory area 32B, and the latter is arranged in the memory area 32A. As a result, when the data are read from the four data cells 11 in which the information symbol DQ is stored, the reference cells 12A arranged in the memory area 32B are used. On the other hand, when the data are read from the parity cells 35 in which the bits corresponding to the column address Y0 of the parity symbol $P_0$ are stored, the reference cells 12A arranged in the memory area 32A are used.

According to such an assignment, the 8 information symbols ad 8 bits of parity symbols are read by using the reference cells 12 different from each other.

In the MRAM in this exemplary embodiment, even if an error is detected in the parity symbol, its error cannot be corrected. This is because even if the data error is detected in each bit of the parity symbol, whether a cause of the error is in the data cell 11 or the reference cell 12 cannot be specified. In this exemplary embodiment, even if any error is detected in the parity symbol, the error in the data cell 11 and the reference cell 12 cannot be corrected.

However, the MRAM in this exemplary embodiment has the great merit that the write currents flowing through the memory arrays 31 can be made uniform when the data is written. As can be understood from FIG. 16, when the data of an address (for example, the column address Y0) is rewritten, the memory cell rewritten in each memory array 31 is one data cell 11 located in the data region 33 and the two memory cells in one parity cell pair 35 located in the parity region 34. Thus, when the data is written, the write currents flowing through the memory arrays 31 are equal. This is effective to prevent the local reduction in the power supply voltage of the MRAM and improve the reliability of the write operation.

As mentioned above, various exemplary embodiments of the present invention have been provided. However, the present invention should not be construed limitedly to the above-mentioned exemplary embodiments. For example, the error correction encoding method employed in the present invention should not be construed limitedly to the Reed-Solomon code. A burst error correction code in which one block is composed of a plurality of symbols can be used instead of the Reed-Solomon code. As an example of such a code, a fire code is employed. Also, in the write operation, the write method other than the toggle write can be employed.

The invention claimed is:

1. An operation method of a magnetic random access memory (MRAM) which stores in memory arrays, error correction codes, each of which comprises symbols, each of which comprises bits, and to which an error correction is possible in units of symbols,
   wherein the symbols are read by using reference cells different from each other, and
   wherein, when a correctable error is detected in a read data of an error correction code from data cells corresponding to an input address, (A) a data in a data cell corresponding to an error bit is corrected for a first error symbol in a single-bit error pattern, and (B) a data in a reference cell that is used to read a second error symbol is corrected for a second error symbol in a multi-bit error pattern.

2. The operation method according to claim 1, wherein after the data in the data cell of the first error symbol is corrected in said (A), a re-reading operation and an error detecting operation are carried out to the data cell for the error correction code are carried out, and
   wherein, when a correctable error is detected again in the re-read data, (C) a data in the reference cell used to read the first error symbol is corrected, and the data in the data cell corrected in said (A) is re-corrected.

3. The operation method according to claim 1, wherein a write data based on the error correction code is encoded from the input data, and
   wherein, when a correctable error is detected in the read data in the data cell of the error correction code corresponding to the input address, (D) the write data is written for a symbol with no error and a first error symbol in the single-bit error pattern, and (E) the write data is written, and the data in the reference cell used to read a second error symbol, for a second error symbol in the multi-bit error pattern.

4. The operation method according to claim 3, wherein after a write operation of the first error symbol into a data cell in said (D) is carried out, a re-read operation and an error detecting operation are carried out on the data cell of the error correction code, and when a correctable error is detected in the re-read data again, (F) the data in the reference cell used to read the first error symbol is corrected.

5. The operation method according to claim 4, wherein in said (F), the write data is written for the first error symbol.

6. The operation method according to claim 1, wherein the symbols of the error correction codes are divided into information symbols and parity symbols, and a read operation from data cells for each of the parity symbols is carried out by using reference cells other than the reference cells used for a read operation from the data cells for each of the information symbols, and the parity symbols are used to detect a data error in the read data as the error correction code.

7. The operation method according to claim 6, wherein the information symbols and the parity symbols are stored in memory arrays different from each other, and a reference cell is used which is arranged in a same memory array as each of the symbols for a read operation from a data cell for the symbol.

8. The operation method according to claim 6, wherein one of the information symbols, one of the parity symbols, a first reference cell, and a second reference cell are arranged in one memory array,
wherein the first reference cell is used for a read operation from the data cell for the information symbol, and
wherein the second reference cell is used for a read operation from the data cell for the parity symbol.

9. The operation method according to claim 6, wherein the error correction codes are divided into a first code and a second code based on an input address,
wherein a first information symbol and a first parity symbol which are included in the first code, a second information symbol, and a second parity symbol which are included in the second code, and a first reference cell and a second reference cell are arranged in a memory array,
wherein, when the first code is selected, the first reference cell is used for a read operation of the first information symbol from a data cell, and the second reference cell is used for a read operation of the first parity symbol from the data cell, and
wherein, when the second code is selected, the second reference cell is used for a read operation of the second information symbol from a data cell, and the first reference cell is used for a read of the second parity symbol from a data cell.

10. The operation method according to claim 1, wherein the symbols of the error correction codes comprise information symbols and parity symbols, and
wherein a read operation from data cells for each of the parity symbols is carried out by using reference cells other than the reference cells used for a read operation from the data cells for each of the information symbols.

11. An operation method of a magnetic random access memory (MRAM), which comprises data cells which store an error correction code to which error correction is possible in units of symbols, reference cells used for read from the data cells, and a peripheral circuit containing an error control coding (ECC) circuit, the error correction code comprising symbols, each of which comprises bits,
wherein each cell of the data cells and the reference cells comprises a toggle cell in which a write operation is carried out by using a toggle operation that a storage data is reversed each time a write current is supplied,
wherein a read operation of the symbols is carried out by using different reference cells, and
wherein, when a correctable error is detected in a read data from the data cells, the peripheral circuit compares bits of the read data and bits of decoded data outputted from the ECC circuit in a case of a first error symbol as an error pattern of one bit, carries out a control of a toggle operation to the data cell of a different bit, namely, an error bit, and a control of the toggle operation to the reference cell used to read a second error symbol, in a case of the second error symbol as an error pattern of plural bits.

12. The operation method according to claim 11, wherein after the toggle operation is carried out to the data cell for an error bit included in the first error symbol, a re-read operation and an error detecting operation to the data cells of the error correction code are carried out, and
wherein, when the error bit is detected again in a same symbol as the first error symbol of the re-read data, the peripheral circuit carries out the control in which the toggle operation is performed to the reference cell used to read the first error symbol and a control the toggle operation is performed to the data cell to which the toggle operation has been performed previously.

13. The operation method according to claim 11, wherein the ECC circuit encodes a write data based on the error correction code from an input data, and
wherein, when a correctable error is detected in a read data from the data cells for the error correction code corresponding to an input address, the peripheral circuit compares bits of the read data and bits of the write data in a case of a symbol having no error and the first error symbol as the error pattern of one bit, and carries out the control to perform the toggle operation to the data cell having a different bit, and compares bits of decoded data outputted by the ECC circuit and the bits of the write data in the case of the second error symbol as the error pattern of plural bits and carries out the control to perform the toggle operation to the reference cell used to read the second error symbol.

14. The operation method according to claim 13, wherein after the toggle operation to the data cell of the first error symbol, the re-read operation and the error detecting operation are carried out to the data cells of the error correction code, and
wherein, when the error bit is detected again in a same symbol as the first error symbol of the re-read data, the peripheral circuit carries out the control to perform the toggle operation to the reference cell used to read the first error symbol, and the control to perform the toggle operation to the data cell for the error bit of one bit included in the first error symbol.

15. An operation method of a magnetic random access memory (MRAM) which comprises data cells which store first to $m^{th}$ block codes as error correction codes to which error correction is possible in units of symbols, first to $n^{th}$ reference cells, and a peripheral circuit comprising first to $m^{th}$ error control coding (ECC) circuits, each of the error correction codes comprising symbols, each of which comprises bits,
wherein data of the first to $m^{th}$ block codes are read out, while using an $i^{th}$ reference cell of the first to $n^{th}$ reference cells, when an $i^{th}$ symbol of each of the first to $m^{th}$ block codes is read,
wherein the error detection is carried out on each of the first to $m^{th}$ block codes by using the first to $m^{th}$ ECC circuits, and
wherein the peripheral circuit corrects the data in the data cell for an error bit, when each of the first to $m^{th}$ ECC circuits detects a correctable error, and an error is detected in one $i^{th}$ symbol of the m $i^{th}$ symbols read by using the $i^{th}$ reference cell, and corrects the data of the $i^{th}$ reference cell, when the error is detected in plural $i^{th}$ symbols.

16. The operation method according to claim 15, wherein a $j^{th}$ ECC circuit of the first to $m^{th}$ ECC circuits encodes $j^{th}$ write data based on the error correction code from an input data, and wherein the peripheral circuit writes the $j^{th}$ write data to the data cell for the $j^{th}$ block code, when each of the first to $m^{th}$ ECC circuits detects a correctable error, and the error is detected in one $i^{th}$ symbol of the m $i^{th}$ symbols read by using the $i^{th}$ reference cell, and writes the write data to the data cell of the $j^{th}$ block code and corrects data of the $i^{th}$ reference cell, when the error is detected in plural $i^{th}$ symbols.

17. The operation method according to claim 15, wherein the data cells and the reference cells comprise toggle cells in which a write operation is carried out by using a toggle operation in which a storage data is reversed, each time a write current is supplied, and wherein, when each of the first to $m^{th}$ ECC circuits detects a correctable error, the peripheral circuit compares bits of a read data of the $i^{th}$ symbol in a $k^{th}$ block code and bits of an $i^{th}$ symbol of decoded data outputted by the $k^{th}$ ECC circuit, in a case of the error is detected in one $i^{th}$ symbol of the m $i^{th}$ symbols read by using the $i^{th}$ reference cell, namely, in a case that an error symbol is detected only in the $i^{th}$ symbol of the $k^{th}$ block code of the first to $m^{th}$ block codes, and carries out the control to perform the toggle operation to the data cell of a different hit, namely, the error bit, and carries out the control to perform the toggle operation to data of the $i^{th}$ reference cell in a case that the error is detected in plural $i^{th}$ symbols.

18. The operation method according to claim 17, wherein the data cells of the $j^{th}$ block code of the first to $m^{th}$ block codes comprise the data cell selected for an input address, and wherein, when each of the first to $m^{th}$ ECC circuits detects a correctable error, the peripheral circuit compares bits of the read data of the $i^{th}$ symbol in the $j^{th}$ block code and bits of the $i^{th}$ symbol in the decoded data outputted by the $j^{th}$ ECC circuit, in the case that the error symbol is detected only in the $i^{th}$ symbol in the $j^{th}$ block code of the m $i^{th}$ symbols read by using the $i^{th}$ reference cell, and carries out the control to perforin the toggle operation to the data cell of the different bit, namely, the error bit, and carries out the control to perform the toggle operation to the data in the $i^{th}$ reference cell in the case that the error is detected in plural $i^{th}$ symbols, and further outputs the decoded data outputted by the $j^{th}$ ECC circuit to the external unit as the read data of the address.

19. The operation method according to claim 18, wherein the $j^{th}$ ECC circuit of the first to $m^{th}$ ECC circuits encodes the $j^{th}$ write data based on the error correction code from the input data, and wherein, when each of the first to $m^{th}$ ECC circuits detects a correctable error, the peripheral circuit compares the bits of the read data of the $i^{th}$ symbol in the $j^{th}$ block code and bits of the data of the $i^{th}$ symbol in the $j^{th}$ write data, in the case that the error symbol is detected only in the $i^{th}$ symbol in the $j^{th}$ block code of the m $i^{th}$ symbols read by using the $i^{th}$ reference cell, and carries out the control to perform the toggle operation to the data cell of the different bit, and carries outs the control to perform the toggle operation to the data in the $i^{th}$ reference cell in the case that the error is detected in plural $i^{th}$ symbols.

20. The operation method according to claim 15, wherein the data cells and the reference cells comprise toggle cells in which a write operation is carried out by using a toggle operation in which a storage data is reversed, each time a write current is supplied.

* * * * *